United States Patent
Lehtola

(10) Patent No.: US 10,084,411 B2
(45) Date of Patent: *Sep. 25, 2018

(54) REDUCED POWER AMPLIFIER SIZE THROUGH ELIMINATION OF MATCHING NETWORK

(71) Applicant: SKYWORKS SOLUTIONS, INC., Woburn, MA (US)

(72) Inventor: Philip John Lehtola, Cedar Rapids, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/869,953

(22) Filed: Sep. 29, 2015

(65) Prior Publication Data

US 2016/0241205 A1 Aug. 18, 2016

Related U.S. Application Data

(60) Provisional application No. 62/116,448, filed on Feb. 15, 2015, provisional application No. 62/116,449, (Continued)

(51) Int. Cl.
*H03F 3/00* (2006.01)
*H03F 1/02* (2006.01)
(Continued)

(52) U.S. Cl.
CPC ......... *H03F 1/0205* (2013.01); *H03F 1/0227* (2013.01); *H03F 1/0288* (2013.01); (Continued)

(58) Field of Classification Search
CPC ... H03F 1/56; H03F 3/191; H03F 3/60; H03F 3/24; H03F 1/0277; H03F 1/14;
(Continued)

(56) References Cited

U.S. PATENT DOCUMENTS 5,774,017 A 6/1998 Adar
5,966,048 A 10/1999 Thompson
(Continued)

FOREIGN PATENT DOCUMENTS

CN 201510632871.X 9/2015
CN 201510633185.4 9/2015
(Continued)

OTHER PUBLICATIONS

U.S. Appl. No. 14/869,957, Radio-Frequency Power Amplifiers Driven by Boost Converter, filed Sep. 29, 2015.
(Continued)

*Primary Examiner* — Golam Sorowar
(74) *Attorney, Agent, or Firm* — Chang & Hale LLP

(57) ABSTRACT

Reduced power amplifier size through elimination of matching network. In some embodiments, a power amplification system can include a power amplifier (PA) configured to receive and amplify a radio-frequency (RF) signal. The power amplification system can further include a filter coupled to the PA and configured to condition the amplified RF signal. The PA can be further configured to drive approximately a characteristic load impedance of the filter. Such a configuration of the PA can be achieved by operating the PA with a high-voltage supply. Such a power amplification system can allow elimination of a matching network to, for example, reduce loss and device size.

15 Claims, 12 Drawing Sheets

Related U.S. Application Data filed on Feb. 15, 2015, provisional application No. 62/116,450, filed on Feb. 15, 2015, provisional application No. 62/116,451, filed on Feb. 15, 2015.

(51) Int. Cl.

| | | |
|---|---|---|
| *H03F 3/21* | (2006.01) | |
| *H03F 1/56* | (2006.01) | |
| *H03F 3/191* | (2006.01) | |
| *H03F 3/24* | (2006.01) | |
| *H03F 3/72* | (2006.01) | |
| *H04B 1/04* | (2006.01) | |

(52) U.S. Cl.
CPC ............ *H03F 1/565* (2013.01); *H03F 3/191* (2013.01); *H03F 3/211* (2013.01); *H03F 3/245* (2013.01); *H03F 3/72* (2013.01); *H03F 2200/102* (2013.01); *H03F 2200/105* (2013.01); *H03F 2200/111* (2013.01); *H03F 2200/171* (2013.01); *H03F 2200/451* (2013.01); *H03F 2203/21109* (2013.01); *H03F 2203/21157* (2013.01); *H03F 2203/7209* (2013.01); *H04B 2001/0408* (2013.01)

(58) Field of Classification Search
CPC .... H03F 1/30; H03F 1/3241; H03F 2200/318; H03F 2200/411; H03F 2200/75; H03F 3/189; H03F 3/211; H03F 3/72; H03F 2203/7215; H03F 2203/7221; H04B 1/0458; H04B 1/005; H04B 1/0057; H04B 1/006; H04B 1/406; H04B 7/0413; H04B 17/10; H04B 1/18; H04B 1/52; H04B 1/40; H04B 2001/045; H03G 3/3042; H03G 3/3036; H03G 1/0023; H03G 3/3078

See application file for complete search history.

(56) References Cited

U.S. PATENT DOCUMENTS

| | | | |
|---|---|---|---|
| 5,973,568 A | 10/1999 | Shapiro et al. | |
| 6,529,715 B1 | 3/2003 | Kitko et al. | |
| 8,461,931 B1 | 6/2013 | Bayruns et al. | |
| 8,532,223 B2 | 9/2013 | Nagatani et al. | |
| 8,710,925 B2 | 4/2014 | Drogi et al. | |
| 8,717,101 B2 | 5/2014 | Li et al. | |
| 9,374,056 B2 | 6/2016 | Bagger et al. | |
| 2006/0189286 A1 | 8/2006 | Kyu et al. | |
| 2008/0157341 A1 | 7/2008 | Yang et al. | |
| 2008/0278136 A1 | 11/2008 | Murtojarvi | |
| 2008/0279262 A1* | 11/2008 | Shanjani .................. H04B 1/48 375/219 |
| 2009/0075608 A1 | 3/2009 | Ichitsubo | |
| 2009/0243719 A1 | 10/2009 | Voisin et al. | |
| 2009/0270137 A1* | 10/2009 | Sorensen ............. H03F 1/0216 455/572 |
| 2009/0289717 A1 | 11/2009 | Tanaka et al. | |
| 2010/0105340 A1 | 4/2010 | Weissman | |
| 2010/0308933 A1* | 12/2010 | See ........................ H03F 1/565 333/32 |
| 2012/0094623 A1 | 4/2012 | Khlat | |
| 2012/0146731 A1 | 6/2012 | Khesbak | |
| 2012/0208473 A1 | 8/2012 | Aparin | |
| 2012/0242410 A1 | 9/2012 | Darwish et al. | |
| 2013/0029619 A1 | 1/2013 | Zhang et al. | |
| 2013/0057451 A1 | 3/2013 | Petty-Weeks et al. | |
| 2013/0130630 A1 | 5/2013 | Crandall | |
| 2014/0002188 A1 | 1/2014 | Chen et al. | |
| 2014/0003000 A1* | 1/2014 | McPartlin ............. H01L 29/732 361/728 |
| 2014/0009226 A1 | 1/2014 | Severson et al. | |
| 2014/0100002 A1* | 4/2014 | Dupuis ................ H03G 3/3042 455/571 |
| 2014/0194072 A1* | 7/2014 | Mach .................... H04B 1/0458 455/73 |
| 2014/0248844 A1 | 9/2014 | Langer | |
| 2014/0266460 A1 | 9/2014 | Nobbe et al. | |
| 2014/0292414 A1* | 10/2014 | Vice ........................ H03F 3/211 330/295 |
| 2014/0312977 A1 | 10/2014 | Kaczman et al. | |
| 2014/0341318 A1* | 11/2014 | Pourkhaatoun ...... H04B 1/0475 375/297 |
| 2014/0361830 A1 | 12/2014 | Mathe et al. | |
| 2015/0072740 A1 | 3/2015 | Gupta | |
| 2015/0236652 A1 | 8/2015 | Yang et al. | |
| 2015/0270813 A1 | 9/2015 | Morshedi | |

FOREIGN PATENT DOCUMENTS

| | | |
|---|---|---|
| CN | 201510634131.X | 9/2015 |
| CN | 201510634701.5 | 9/2015 |
| CN | 201510641587.9 | 9/2015 |
| DE | 102015218733.0 | 9/2015 |
| DE | 102015218750.0 | 9/2015 |
| DE | 102015218848.5 | 9/2015 |
| DE | 102015218849.3 | 9/2015 |
| DE | 102015218916.3 | 9/2015 |
| JP | S5873201 | 5/1983 |
| JP | 2004289428 | 10/2004 |
| JP | 2006287337 | 10/2006 |
| JP | 2007019585 | 1/2007 |
| JP | 2010226120 | 10/2010 |
| JP | 2014187432 | 10/2014 |
| JP | 2015-189648 | 9/2015 |
| JP | 2015-190601 | 9/2015 |
| JP | 2015-190639 | 9/2015 |
| JP | 2015-190649 | 9/2015 |
| JP | 2015-192593 | 9/2015 |
| KR | 100645080 | 11/2006 |
| KR | 1020100116656 | 11/2010 |
| KR | 101283202 | 7/2013 |
| KR | 1020140040140 | 4/2014 |
| KR | 1020140067135 | 6/2014 |
| KR | 1020140121868 | 10/2014 |
| KR | 101467231 | 12/2014 |
| KR | 10-2015-0137448 | 9/2015 |
| KR | 10-2015-0138218 | 9/2015 |
| KR | 10-2015-0138231 | 9/2015 |
| KR | 10-2015-0138237 | 9/2015 |
| KR | 10-2015-0138260 | 9/2015 |
| TW | 201249100 | 12/2012 |
| TW | 104132230 | 9/2015 |
| TW | 104132268 | 9/2015 |
| TW | 104132269 | 9/2015 |
| TW | 104132281 | 9/2015 |
| TW | 104132332.0 | 9/2015 |
| WO | 2007129716 | 11/2007 |
| WO | 2009100381 | 8/2009 |
| WO | 2012098863 | 7/2012 |
| WO | 2012151322 | 11/2012 |
| WO | 2012158423 | 11/2012 |
| WO | 2013040505 | 3/2013 |
| WO | 2013/119587 | 8/2013 |
| WO | 2013188712 | 12/2013 |

OTHER PUBLICATIONS

U.S. Appl. No. 14/869,954, Enhanced Power Amplifier Efficiency Through Elimination of Matching Network, filed Sep. 29, 2015.
U.S. Appl. No. 14/869,955, Enhanced Power Amplifier Efficiency Through Elimination of Matching Network, filed Sep. 29, 2015.
U.S. Appl. No. 14/869,956, Multi-Band Device Having Multiple Miniaturized Single-Band Power Amplifiers, filed Sep. 29, 2015.

* cited by examiner

REDUCED POWER AMPLIFIER SIZE THROUGH ELIMINATION OF MATCHING NETWORK

CROSS-REFERENCE TO RELATED APPLICATION(S)

This application claims priority to U.S. Provisional Application No. 62/116,448 filed Feb. 15, 2015, entitled REDUCED POWER AMPLIFIER SIZE THROUGH ELIMINATION OF MATCHING NETWORK, U.S. Provisional Application No. 62/116,449 filed Feb. 15, 2015, entitled ENHANCED POWER AMPLIFIER EFFICIENCY THROUGH ELIMINATION OF MATCHING NETWORK, U.S. Provisional Application No. 62/116,450 filed Feb. 15, 2015, entitled MULTI-BAND POWER AMPLIFICATION SYSTEM HAVING ENHANCED EFFICIENCY THROUGH ELIMINATION OF BAND SELECTION SWITCH, and U.S. Provisional Application No. 62/116,451 filed Feb. 15, 2015, entitled MULTI-BAND DEVICE HAVING MULTIPLE MINIATURIZED SINGLE-BAND POWER AMPLIFIERS, the disclosure of each of which is hereby expressly incorporated by reference herein in its entirety.

BACKGROUND

Field

The present disclosure generally relates to power amplifiers for radio-frequency (RF) applications.

Description of the Related Art

In radio-frequency (RF) applications, an RF signal to be transmitted is typically generated by a transceiver. Such an RF signal can then be amplified by a power amplifier (PA), and the amplified RF signal can be routed to an antenna for transmission.

SUMMARY

According to a number of implementations, the present disclosure relates to a power amplification system that includes a power amplifier (PA) configured to receive and amplify a radio-frequency (RF) signal, and a filter coupled to the PA and configured to condition the amplified RF signal. The PA is further configured to drive approximately a characteristic load impedance of the filter.

In some embodiments, the PA can have an impedance that is greater than approximately 40 Ohms. The impedance of the PA can have a value of approximately 50 Ohms.

In some embodiments, power amplification system can further include a supply system configured to provide a high-voltage (HV) supply to the PA. The supply system can include a boost DC/DC converter configured to generate the HV supply based on a battery voltage Vbatt.

In some embodiments, the PA can include a heterojunction bipolar transistor (HBT). The HBT can be, for example, a gallium arsenide (GaAs) device. The HV supply can be provided to a collector of the HBT as VCC.

In some embodiments, the filter can be a transmit (Tx) filter configured to operate in a corresponding Tx frequency band. The Tx filter can be part of a duplexer configured to operate in the Tx frequency band and a corresponding receive (Rx) frequency band.

In some embodiments, the filter can be coupled to the PA by an output path that is substantially free of an impedance transformation circuit.

In some embodiments, the power amplification system can further include one or more additional PAs, with each being configured to operate with the HV supply and amplify a corresponding RF signal. The power amplification system can further include a filter coupled to each of the one or more additional PAs and configured to condition the corresponding amplified RF signal. Each of the one or more additional PAs can be further configured to drive approximately a characteristic load impedance of the corresponding filter. Each of the one or more additional filters can be coupled to the corresponding PA by an output path that is substantially free of an impedance transformation circuit.

In some embodiments, the PA and the one or more additional PAs can form M PAs. In some embodiments, the M PAs can be implemented on a single semiconductor die. The M PAs can be configured to operate in separate frequency bands. The system can be substantially free of a band selection switch between the M PAs and their corresponding filters.

In some embodiments, the power amplification system can be configured to operate as an average power tracking (APT) system. The APT system can have a lower loss than another power amplifier system having similar band handling capability but in which the PAs are operated in low voltage. The other power amplifier system can be an envelope tracking (ET) system. The APT system can have an overall efficiency that is greater than an overall efficiency of the ET system.

In some teachings, the present disclosure relates to a radio-frequency (RF) module that includes a packaging substrate configured to receive a plurality of components, and a power amplification system implemented on the packaging substrate. The power amplification system includes a plurality of power amplifiers (PAs), with each PA being configured to receive and amplify a radio-frequency (RF) signal. The power amplification system further includes a filter coupled to each PA that is configured to drive approximately a characteristic load impedance of the filter.

In some embodiments, each PA can be configured to operate in a high-voltage (HV) supply mode. Each filter can be coupled to the corresponding PA by an output path that is substantially free of an impedance transformation circuit.

In some embodiments, the RF module can be substantially free of a band selection switch between the plurality of PAs and their corresponding filters. In some embodiments, the RF module can be, for example, a front-end module (FEM).

According to some implementations, the present disclosure relates to a wireless device that includes a transceiver configured to generate a radio-frequency (RF) signal, and a front-end module (FEM) in communication with the transceiver. The FEM includes a packaging substrate configured to receive a plurality of components, and a power amplification system implemented on the packaging substrate. The power amplification system includes a plurality of power amplifiers (PAs), with each PA being configured to receive and amplify a radio-frequency (RF) signal. The power amplification system further includes a filter coupled to each PA that is configured to drive approximately a characteristic load impedance of the filter. The wireless device further includes an antenna in communication with the FEM, with the antenna being configured to transmit the amplified RF signal.

In some teachings, the present disclosure relates to a method for processing a radio-frequency (RF) signal. The method includes amplifying the RF signal with a power amplifier (PA), and routing the amplified RF signal to a filter. The method further includes operating the PA such that the PA drives approximately a characteristic impedance of the filter.

In some embodiments, the PA can have an impedance that is approximately 50 Ohms. In some embodiments, operating the PA can include supplying the PA with a high-voltage (HV).

In accordance with a number of teachings, the present disclosure relates to a power amplification system that includes a power amplifier (PA) configured to receive and amplify a radio-frequency (RF) signal. The power amplification system further includes an output filter coupled to the PA by an output path that is substantially free of an impedance transformation circuit.

In some embodiments, the PA can be further configured to drive approximately a characteristic load impedance of the output filter. The PA being configured to drive approximately the characteristic load impedance of the output filter can be effectuated by the PA being operated with a high-voltage (HV) supply. The output path being substantially free of an impedance transformation circuit can result in a reduction in loss by at least 0.5 dB between the PA and the output filter.

In some embodiments, the PA can have an impedance that is greater than approximately 40 Ohms. The impedance of the PA can have a value of approximately 50 Ohms. The impedance of the PA can result in a reduced current drain in the PA. The reduced current drain in the PA can allow the PA to be dimensioned smaller than another PA having a lower impedance.

In some embodiments, the power amplification system can further include a supply system configured to provide a high-voltage (HV) supply to the PA. The supply system can include a boost DC/DC converter configured to generate the HV supply based on a battery voltage Vbatt.

In some embodiments, the PA can include a heterojunction bipolar transistor (HBT). The HBT can be a gallium arsenide (GaAs) device. The HV supply can be provided to a collector of the HBT as VCC.

In some embodiments, the output filter can be a transmit (Tx) filter configured to operate in a corresponding Tx frequency band. The Tx filter can be part of a duplexer configured to operate in the Tx frequency band and a corresponding receive (Rx) frequency band.

In some embodiments, the power amplification system can further include one or more additional PAs, with each being configured to operate with the HV supply and amplify a corresponding RF signal. The power amplification system can further include an output filter coupled to each of the one or more additional PAs by an output path that is substantially free of an impedance transformation circuit. Each of the one or more additional PAs can be further configured to drive approximately a characteristic load impedance of the corresponding output filter.

In some embodiments, the PA and the one or more additional PAs can form M PAs. The M PAs can be implemented on a single semiconductor die. The M PAs can be configured to operate in separate frequency bands.

In some embodiments, the power amplification system can be substantially free of a band selection switch between the M PAs and their corresponding output filters. The power amplification system being substantially free of a band selection switch can result in a reduction in loss by at least 0.3 dB between a given PA and the corresponding output filter.

In some embodiments, the power amplification system can be configured to operate as an average power tracking (APT) system. The APT system can have a lower loss than another power amplifier system having similar band handling capability but in which the PAs are operated in low voltage. The other power amplifier system can be an envelope tracking (ET) system. The APT system can have an overall efficiency that is greater than an overall efficiency of the ET system.

According to some implementations, the present disclosure relates to a radio-frequency (RF) module that includes a packaging substrate configured to receive a plurality of components, and a power amplification system implemented on the packaging substrate. The power amplification system includes a plurality of power amplifiers (PAs), with each PA being configured to receive and amplify a radio-frequency (RF) signal. The power amplification system further includes an output filter coupled to each of the PAs by an output path that is substantially free of an impedance transformation circuit.

In some embodiments, each PA can be configured to operate in a high-voltage (HV) supply mode. Each PA can be further configured to drive approximately a characteristic load impedance of the corresponding output filter.

In some embodiments, the RF module can be substantially free of a band selection switch between the plurality of PAs and their corresponding output filters. The RF module can be, for example, a front-end module (FEM).

In some implementations, the present disclosure relates to a wireless device that includes a transceiver configured to generate a radio-frequency (RF) signal, and a front-end module (FEM) in communication with the transceiver. The FEM includes a packaging substrate configured to receive a plurality of components, and a power amplification system implemented on the packaging substrate. The power amplification system includes a plurality of power amplifiers (PAs), with each PA being configured to receive and amplify a radio-frequency (RF) signal. The power amplification system further includes an output filter coupled to each of the PAs by an output path that is substantially free of an impedance transformation circuit. The wireless device further includes an antenna in communication with the FEM, with the antenna being configured to transmit the amplified RF signal.

In some teachings, the present disclosure relates to a method for processing a radio-frequency (RF) signal. The method includes amplifying the RF signal with a power amplifier (PA), and routing the amplified RF signal to an output filter substantially without impedance transformation. The method further includes filtering the amplified RF signal with the output filter.

In some embodiments, amplifying the RF signal can include operating the PA such that the PA drives approximately a characteristic impedance of the output filter to allow the routing substantially without the impedance transformation. The PA can have an impedance that is approximately 50 Ohms. In some embodiments, operating the PA can include supplying the PA with a high-voltage (HV).

In accordance with some teachings, the present disclosure relates to a power amplification system that includes a plurality of power amplifiers (PAs), with each PA being configured to receive and amplify a radio-frequency (RF) signal in a frequency band. The power amplification system can further include an output filter coupled to each of the PAs by a separate output path such that the power amplification system is substantially free of a band selection switch between the plurality of PAs and their corresponding output filters.

In some embodiments, each of the PAs can be further configured to drive approximately a characteristic load impedance of the corresponding output filter. Each PA being configured to drive approximately the characteristic load impedance of the corresponding output filter can be effectuated by the PA being operated with a high-voltage (HV) supply. The power amplification system being substantially free of the band selection switch can result in a reduction in loss by at least 0.3 dB between each PA and the corresponding output filter.

In some embodiments, each PA can have an impedance that is greater than approximately 40 Ohms. The impedance of each PA can have a value of approximately 50 Ohms. The impedance of each PA results in a reduced current drain in the PA. The reduced current drain in each PA can allow the PA to be dimensioned smaller than another PA having a lower impedance.

In some embodiments, the power amplification system can further include a supply system configured to provide a high-voltage (HV) supply to each PA. The supply system can include a boost DC/DC converter configured to generate the HV supply based on a battery voltage Vbatt.

In some embodiments, each PA can include a heterojunction bipolar transistor (HBT). The HBT can be a gallium arsenide (GaAs) device. The HV supply can be provided to a collector of the HBT as VCC.

In some embodiments, each output filter can be a transmit (Tx) filter configured to operate in a corresponding Tx frequency band. The Tx filter can be part of a duplexer configured to operate in the Tx frequency band and a corresponding receive (Rx) frequency band.

In some embodiments, each output filter can be coupled to the corresponding PA by an output path that is substantially free of an impedance transformation circuit. Each output path being substantially free of an impedance transformation circuit can result in a reduction in loss by at least 0.5 dB between the corresponding PA the output filter.

In some embodiments, the plurality of PAs can be implemented on a single semiconductor die. In some embodiments, the power amplification system can be configured to operate as an average power tracking (APT) system. The APT system can have a lower loss than another power amplifier system having similar band handling capability but in which the PAs are operated in low voltage. The other power amplifier system can be an envelope tracking (ET) system. The APT system can have an overall efficiency that is greater than an overall efficiency of the ET system.

In some teachings, the present disclosure relates to a radio-frequency (RF) module having a packaging substrate configured to receive a plurality of components, and a power amplification system implemented on the packaging substrate. The power amplification system includes a plurality of power amplifiers (PAs), with each PA being configured to receive and amplify a radio-frequency (RF) signal in a frequency band. The power amplification system further includes an output filter coupled to each of the PAs by a separate output path such that the power amplification system is substantially free of a band selection switch between the plurality of PAs and their corresponding output filters.

In some embodiments, each PA can be configured to operate in a high-voltage (HV) supply mode. Each PA can be further configured to drive approximately a characteristic load impedance of the corresponding output filter.

In some embodiments, each output path can be substantially free of an impedance transformation circuit between the corresponding PA and output filter. In some embodiments, the RF module can be a front-end module (FEM).

According to a number of teachings, the present disclosure relates to a wireless device that includes a transceiver configured to generate a radio-frequency (RF) signal, and a front-end module (FEM) in communication with the transceiver. The FEM includes a packaging substrate configured to receive a plurality of components, and a power amplification system implemented on the packaging substrate. The power amplification system includes a plurality of power amplifiers (PAs), with each PA being configured to receive and amplify a radio-frequency (RF) signal in a frequency band. The power amplification system further includes an output filter coupled to each of the PAs by a separate output path such that the power amplification system is substantially free of a band selection switch between the plurality of PAs and their corresponding output filters. The wireless device further includes an antenna in communication with the FEM, with the antenna being configured to transmit the amplified RF signal.

In some teachings, the present disclosure relates to a method for processing a radio-frequency (RF) signal. The method includes amplifying the RF signal with a selected one of a plurality of power amplifiers (PAs), with the RF signal being in a frequency band. The method further includes routing the amplified RF signal to an output filter substantially without a band-selection switching operation. The method further includes filtering the amplified RF signal with the output filter.

In some embodiments, amplifying the RF signal can include operating the selected PA such that the PA drives approximately a characteristic impedance of the corresponding output filter to allow the routing substantially without an impedance transformation. The PA can have an impedance that is approximately 50 Ohms.

In some embodiments, operating the PA can include supplying the PA with a high-voltage (HV).

In some implementations, the present disclosure relates to a power amplifier die that includes a semiconductor substrate a plurality of power amplifiers (PAs) implemented on the semiconductor substrate. Each PA is configured to drive approximately a characteristic load impedance of a downstream component along an individual frequency band signal path. Each PA is sized smaller than a wide band PA configured to drive more than one of the frequency bands associated with the plurality of PAs.

In some embodiments, the downstream component can include an output filter. The individual frequency band signal path can be a narrow band signal path. Each of the PAs being configured to drive approximately the characteristic load impedance of the corresponding output filter can be effectuated by the PA being operated with a high-voltage (HV) supply. Each PA can have an impedance that is greater than approximately 40 Ohms. The impedance of each PA can have a value of approximately 50 Ohms. The impedance of each PA can result in a reduced current drain in the PA. The reduced current drain in each PA can allow the PA to be dimensioned smaller than another PA having a lower impedance.

In some embodiments, each PA can include a heterojunction bipolar transistor (HBT) such as a gallium arsenide (GaAs) device. The HBT can be configured to receive the HV supply through its collector as VCC.

In some embodiments, the PAs can be configured to operate in an average power tracking (APT) mode. The APT mode can result in a lower loss than another die having similar band handling capability but in which the PAs are operated in low voltage. The other die can be configured to operate in an envelope tracking (ET) mode. The APT mode can yield an overall efficiency that is greater than an overall efficiency of associated with the ET.

According to some implementations, the present disclosure relates to a radio-frequency (RF) module that includes a packaging substrate configured to receive a plurality of components, and a power amplification system implemented on the packaging substrate. The power amplification system includes a plurality of power amplifiers (PAs) implemented on a semiconductor substrate. Each PA is configured to drive approximately a characteristic load impedance of a downstream component along an individual frequency band signal path. Each PA is sized smaller than a wide band PA configured to drive more than one of the frequency bands associated with the plurality of PAs.

In some embodiments, each PA can be configured to operate in a high-voltage (HV) supply mode. In some embodiments, the downstream component can include an output filter. The output filter can be coupled to the corresponding PA by a separate output path such that the power amplification system is substantially free of a band selection switch between the plurality of PAs and their corresponding output filters. Each output path can be substantially free of an impedance transformation circuit between the corresponding PA and output filter. The RF module can be, for example, a front-end module (FEM).

In some teachings, the present disclosure relates to a wireless device that includes a transceiver configured to generate a radio-frequency (RF) signal, and a front-end module (FEM) in communication with the transceiver. The FEM includes a packaging substrate configured to receive a plurality of components, and a power amplification system implemented on the packaging substrate. The power amplification system includes a plurality of power amplifiers (PAs) implemented on a semiconductor substrate, with each PA being configured to drive approximately a characteristic load impedance of a downstream component along an individual frequency band signal path. Each PA is sized smaller than a wide band PA configured to drive more than one of the frequency bands associated with the plurality of PAs. The wireless device further includes an antenna in communication with the FEM, with the antenna being configured to transmit an amplified RF signal.

In some implementations, the present disclosure relates to a method for processing a radio-frequency (RF) signal. The method includes amplifying the RF signal with a selected one of a plurality of power amplifiers (PAs), with the selected PA driving approximately a characteristic load impedance of a downstream component along an individual frequency band signal path. The selected PA is sized smaller than a wide band PA configured to drive more than one of the frequency bands associated with the plurality of PAs. The method further includes routing the amplified RF signal to the downstream component.

In some embodiments, the downstream component can include an output filter. Amplifying the RF signal can include supplying the selected PA with a high-voltage (HV).

In accordance with some teachings, the present disclosure relates to a method for fabricating a power amplifier die. The method includes forming or providing a semiconductor substrate, and implementing a plurality of individual frequency band signal paths. The method further includes forming a plurality of power amplifiers (PAs) on the semiconductor substrate, with each PA being configured to drive approximately a characteristic load impedance of a downstream component along the corresponding individual frequency band signal path. Each PA is sized smaller than a wide band PA configured to drive more than one of the frequency bands associated with the plurality of PAs.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

The present disclosure relates to U.S. patent application Ser. No. 14/869,954, entitled ENHANCED POWER AMPLIFIER EFFICIENCY THROUGH ELIMINATION OF MATCHING NETWORK, U.S. patent application Ser. No. 14/869,955, entitled MULTI-BAND POWER AMPLIFICATION SYSTEM HAVING ENHANCED EFFICIENCY THROUGH ELIMINATION OF BAND SELECTION SWITCH, and U.S. patent application Ser. No. 14/869,956, entitled MULTI-BAND DEVICE HAVING MULTIPLE MINIATURIZED SINGLE-BAND POWER AMPLIFIERS, the disclosure of each of which is filed on even date herewith and hereby incorporated by reference herein in its entirety.

DETAILED DESCRIPTION OF SOME EMBODIMENTS

The headings provided herein, if any, are for convenience only and do not necessarily affect the scope or meaning of the claimed invention.

Figure 1:
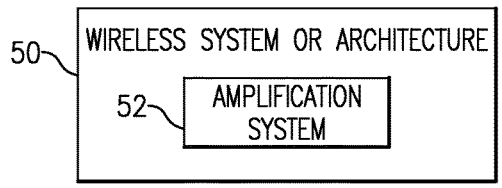
FIG. 1 depicts a wireless system or architecture having an amplification system.

Introduction:

Referring to FIG. 1, one or more features of the present disclosure generally relate to a wireless system or architecture 50 having an amplification system 52. In some embodiments, the amplification system 52 can be implemented as one or more devices, and such device(s) can be utilized in the wireless system/architecture 50. In some embodiments, the wireless system/architecture 50 can be implemented in, for example, a portable wireless device. Examples of such a wireless device are described herein.

Figure 2:
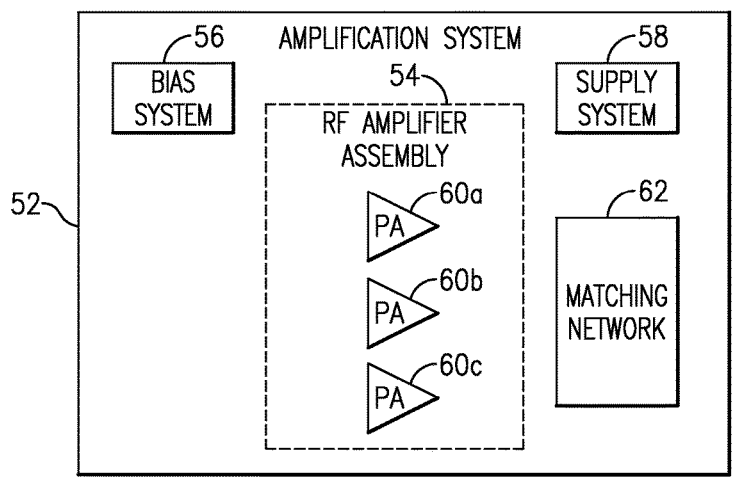
FIG. 2 shows that the amplification system of FIG. 1 can include a radio-frequency (RF) amplifier assembly having one or more power amplifiers (PAs).

FIG. 2 shows that the amplification system 52 of FIG. 1 can include a radio-frequency (RF) amplifier assembly 54 having one or more power amplifiers (PAs). In the example of FIG. 2, three PAs 60a-60c are depicted as forming the RF amplifier assembly 54. It will be understood that other numbers of PA(s) can also be implemented. It will also be understood that one or more features of the present disclosure can also be implemented in RF amplifier assemblies having other types of RF amplifiers.

In some embodiments, the RF amplifier assembly 54 can be implemented on one or more semiconductor die, and such die can be included in a packaged module such as a power amplifier module (PAM) or a front-end module (FEM). Such a packaged module is typically configured to be mounted on a circuit board associated with, for example, a portable wireless device.

The PAs (e.g., 60a-60c) in the amplification system 52 can be typically biased by a bias system 56. Further, supply voltages for the PAs can be typically provided by a supply system 58. In some embodiments, either or both of the bias system 56 and the supply system 58 can be included in the foregoing packaged module having the RF amplifier assembly 54.

In some embodiments, the amplification system 52 can include a matching network 62. Such a matching network can be configured to provide input matching and/or output matching functionalities for the RF amplifier assembly 54.

Figure 3A:
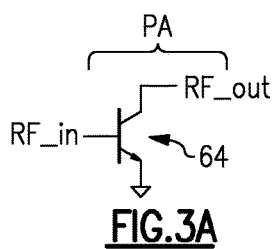
FIGS. 3A-3E show non-limiting examples of how each PA of FIG. 2 can be configured.

For the purpose of description, it will be understood that each PA (60) of FIG. 2 can be implemented in a number of ways. FIGS. 3A-3E show non-limiting examples of how such a PA can be configured. FIG. 3A shows an example PA having an amplifying transistor 64, where an input RF signal (RF_in) is provided to a base of the transistor 64, and an amplified RF signal (RF_out) is output through a collector of the transistor 64.

Figure 3B:
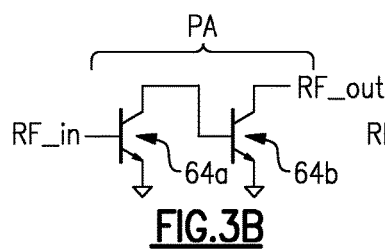

FIG. 3B shows an example PA having a plurality of amplifying transistors (e.g., 64a, 64b) arranged in stages. An input RF signal (RF_in) is shown to be provided to a base of the first transistor 64a, and an amplified RF signal from the first transistor 64a is shown to be output through its collector. The amplified RF signal from the first transistor 64a is shown to be provided to a base of the second transistor 64b, and an amplified RF signal from the second transistor 64b is shown to be output through its collector to thereby yield an output RF signal (RF_out) of the PA.

Figure 3C:
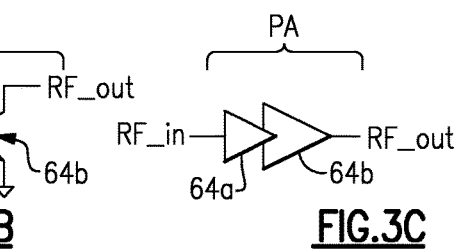

In some embodiments, the foregoing example PA configuration of FIG. 3B can be depicted as two or more stages as shown in FIG. 3C. The first stage 64a can be configured as, for example, a driver stage; and the second stage 64b can be configured as, for example, an output stage.

Figure 3D:
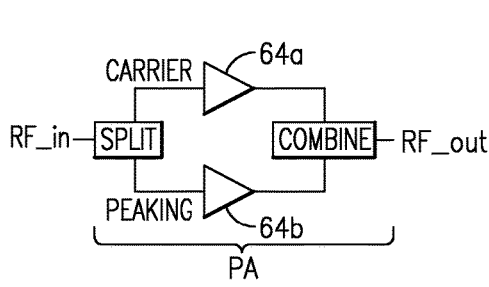

FIG. 3D shows that in some embodiments, a PA can be configured as a Doherty PA. Such a Doherty PA can include amplifying transistors 64a, 64b configured to provide carrier amplification and peaking amplification, respectively, of an input RF signal (RF_in), to yield an amplified output RF signal (RF_out). The input RF signal can be split into the carrier portion and the peaking portion by a splitter. The amplified carrier and peaking signals can be combined to yield the output RF signal by a combiner.

Figure 3E:
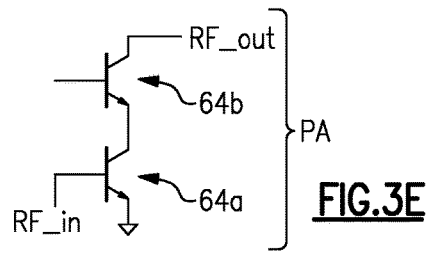

FIG. 3E shows that in some embodiments, a PA can be implemented in a cascode configuration. An input RF signal (RF_in) can be provided to a base of the first amplifying transistor 64a operated as a common emitter device. The output of the first amplifying transistor 64a can be provided through its collector and be provided to an emitter of the second amplifying transistor 64b operated as a common base device. The output of the second amplifying transistor 64b can be provided through its collector so as to yield an amplified output RF signal (RF_out) of the PA.

In the various examples of FIGS. 3A-3E, the amplifying transistors are described as bipolar junction transistors (BJTs) such as heterojunction bipolar transistors (HBTs). It will be understood that one or more features of the present disclosure can also be implemented in or with other types of transistors such as field-effect transistors (FETs).

Figure 4:
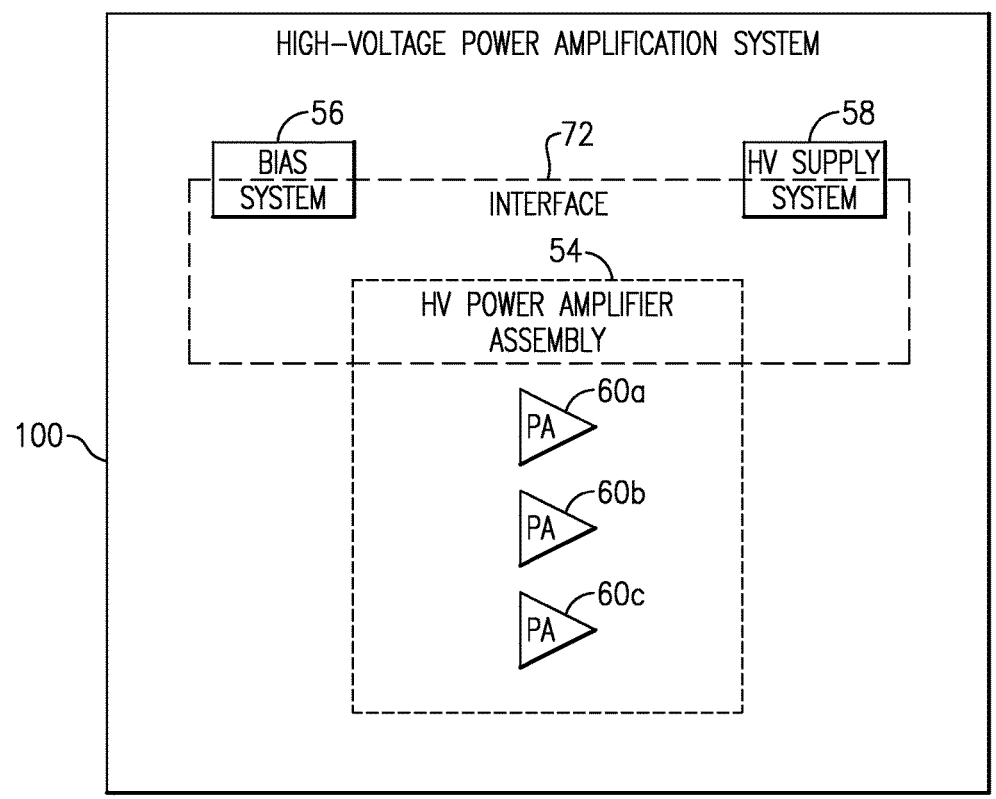
FIG. 4 shows that in some embodiments, the amplification system of FIG. 2 can be implemented as a high-voltage (HV) power amplification system.

FIG. 4 shows that in some embodiments, the amplification system 52 of FIG. 2 can be implemented as a high-voltage (HV) power amplification system 100. Such a system can include an HV power amplifier assembly 54 configured to include HV amplification operation for some or all of the PAs (e.g., 60a-60c). As described herein, such PAs can be biased by a bias system 56. In some embodiments, the foregoing HV amplification operation can be facilitated by an HV supply system 58. In some embodiments, an interface system 72 can be implemented to provide interface functionalities between the HV power amplifier assembly 54 and either or both of the bias system 56 and the HV supply system 58.

Examples Related to HV APT Systems:

Many wireless devices such as cellular handsets are configured to support multiple frequency bands; and such devices typically require and/or complex power amplification architectures. However, such complexity in power amplification architectures can result in degradation of transmit efficiency as the number of supported bands increases. Such a degradation in efficiency can be due to, for example, increased loss incurred by combining of multiple frequency bands while maintaining competitive size and cost targets.

In some radio-frequency (RF) applications, portable transmit solutions can include a battery voltage (e.g., 3.8V) power amplifier (PA) combined with a Buck switching power supply. In such an example approach, maximum transmit power is typically achieved at the 3.8V battery voltage, which typically requires or utilizes a 13:1 impedance transformation network within the PA to support, for example, a nearly 1.5 watt peak power level.

In the foregoing example, efficiency improvement at lower transmit power levels can be supported by implementing a Buck power supply at voltages below the battery voltage. Multi-band operation can be accomplished using an RF switch to select a desired filter corresponding to a desired frequency band. It is noted that some or all of the Buck power supply, the impedance transformation network and the RF switch can contribute to loss, which in turn reduces the transmit efficiency.

Some wireless systems can include an envelope-tracking (ET) feature implemented into a Buck supply to provide an increase in system efficiency. However, envelope tracking can increase the cost of the Buck switching supply, and can also significantly complicate the system characterization and calibration process.

Figure 5:
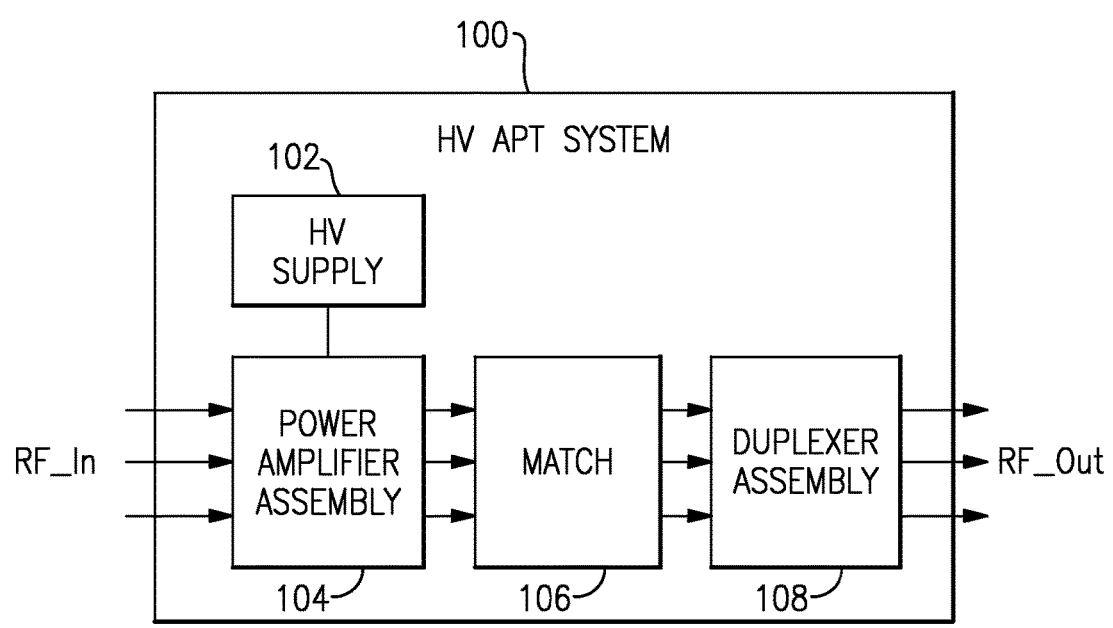
FIG. 5 shows that in some embodiments, the HV power amplification system of FIG. 4 can be configured to operate in an average power tracking (APT) mode.

Described herein are examples of systems, circuits, devices and methods that can significantly reduce loss while maintaining or improving competitive levels of size and/or cost. FIG. 5 shows that in some embodiments, the HV power amplification system 100 of FIG. 4 can be configured to operate in an average power tracking (APT) mode. In the example of FIG. 5, an HV APT power amplification system 100 can include a power amplifier assembly 104 having one or more PAs configured to amplify one or more RF signals (RF_In). Such amplified RF signal(s) can be routed to a duplexer assembly 108 having one or more duplexers, through a match component 106 having one or more matching circuits.

The duplexer(s) can allow duplexing of transmit (Tx) and receive (Rx) operations. The Tx portion of such duplexing operations is depicted as one or more amplified RF signals (RF_Out) being output from the duplexer assembly 108 for transmission through an antenna (not shown). In the example of FIG. 5, the Rx portion is not shown; however, received signals from an antenna can be received by the duplexer assembly 108 and output to, for example, low-noise amplifiers (LNAs).

Various examples are described herein in the context of Tx and Rx operations utilizing duplexers, and such duplexers can facilitate, for example, frequency-division duplexing (FDD) functionality. It will be understood that in some embodiments, an HV power amplification system having one or more features as described herein can also be implemented in other duplexing configurations, including, for example, time-division duplexing (TDD) configuration.

In the example of FIG. 5, an HV supply system 102 is shown to provide one or more HV supply signals to the power amplifier assembly 104. More specific examples of how such HV signal(s) can be provided to corresponding PA(s) are described herein in greater detail.

In some embodiments, the HV APT power amplification system 100 of FIG. 5 can be configured to operate in an APT mode and meet or exceed performance provided by envelope tracking (ET) implementations, while maintaining or reducing cost and/or complexity. In some embodiments, such an HV APT power amplification system can utilize high-voltage capability of some PAs such as, for example, gallium arsenide (GaAs) heterojunction bipolar transistor (HBT) PAs. It will be understood that one or more features of the present disclosure can also be implemented with other types of PAs. For example, amplification systems utilizing CMOS devices with LDMOS multiple cascode stages, silicon bipolar devices, and GaN/HEMT devices can also benefit from operation in high-voltage regions.

With such HV operation of PAs, one or more lossy components can be eliminated from an amplification system, and/or other advantageous benefit(s) can be realized. For example, PA output matching network(s) can be eliminated. In another example, PA supply efficiency can be increased. In yet another example, some passive components can be removed. Examples related to the foregoing are described herein in greater detail.

One or more of the foregoing features associated with HV operation can result in one or more die being implemented in smaller dimensions, thereby allowing greater flexibility in power amplification system designs. For example, a power amplification system can be implemented with an increased number of relatively small PAs, to thereby allow elimination of lossy components such as band switches. Examples related to such elimination of band switches are described herein in greater detail.

In some embodiments, the HV APT power amplification system 100 of FIG. 5 can be configured so as to substantially eliminate or reduce complexities associated with envelope tracking characterization and/or calibration processes.

For the purpose of description, it will be understood that high-voltage (HV) can include voltage values that are higher than a battery voltage utilized in portable wireless devices. For example, an HV can be greater than 3.7V or 4.2V. In some situations, an HV can include voltage values that are greater than a battery voltage and at which portable wireless devices can operate more efficiently. In some situations, an HV can include voltage values that are greater than a battery voltage and less than a breakdown voltage associated with a given type of PA. In the example context of GaAs HBT, such a breakdown voltage can be in a range of 15V to 25V. Accordingly, an HV for GaAs HBT PA can be in a range of, for example, 3.7V to 25V, 4.2V to 20V, 5V to 15V, 6V to 14V, 7V to 13V, or 8V to 12V.

Figure 6:
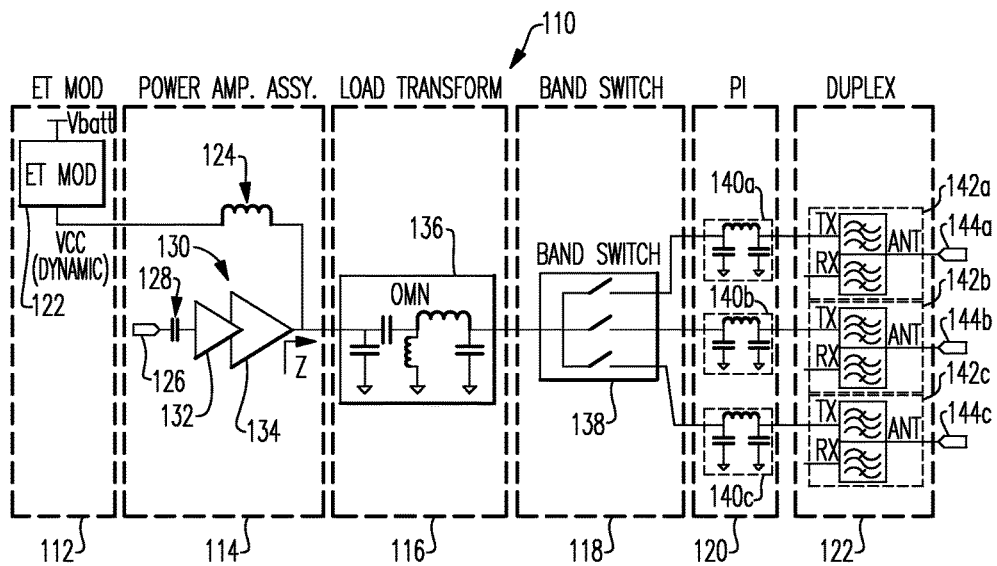
FIG. 6 shows an example envelope tracking (ET) power amplification system.
Figure 7:
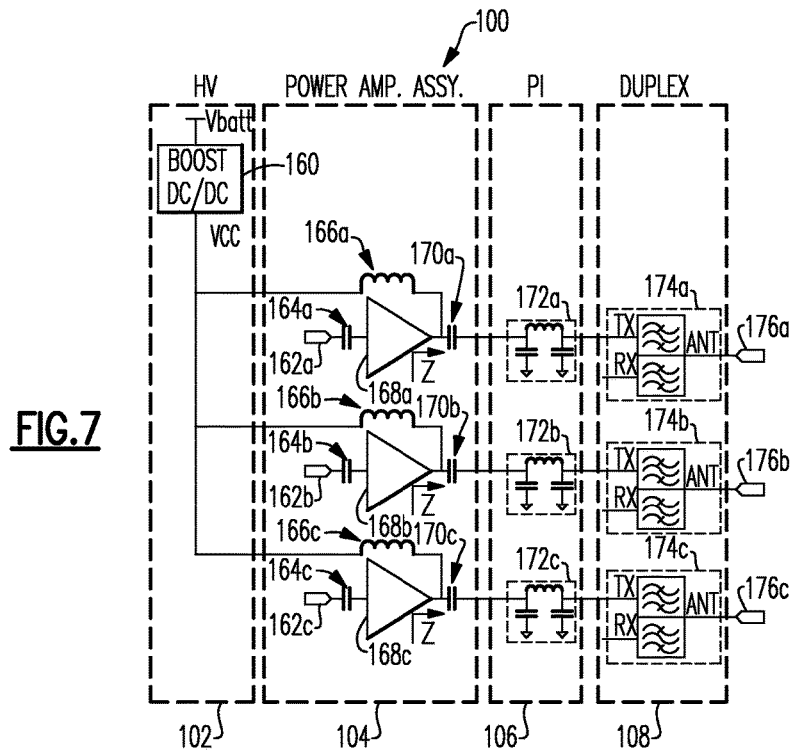
FIG. 7 shows an example high-voltage (HV) average power tracking (APT) power amplification system having one or more features as described herein.

FIGS. 6 and 7 show a comparison between an envelope tracking (ET) power amplification system 110 (FIG. 6) and a high-voltage (HV) average power tracking (APT) power amplification system 100 (FIG. 7) to demonstrate how some lossy components can be substantially eliminated in the HV APT power amplification system 100. For the purpose of comparison, it will be assumed that each power amplification system is configured to provide amplification for three frequency bands. However, it will be understood that more or less numbers of frequency bands can be utilized.

In the example of FIG. 6, the ET power amplification system 110 is shown to include a power amplifier assembly 114 having a broadband amplification path 130 capable of providing amplification for three frequency bands. The amplification path 130 can receive an input RF signal through a common input node 126, and such an RF signal can be routed to one or more amplification stages through, for example, a DC-block capacitance 128. The amplification stages can include, for example, a driver stage 132 and an output stage 134. In some embodiments, the amplification stages 132, 134 can include, for example, HBT or CMOS amplification transistors.

In the example of FIG. 6, the collector of the output stage 134 is shown to be provided with a supply voltage VCC from an envelope tracking (ET) modulator 122 through a choke inductance 124. The ET modulator 122 is depicted as being part of an ET modulation system 112. The supply voltage VCC provided by such an ET modulator is typically determined in a dynamic manner, and can have a value in a range of, for example, about 1V to 3V. The ET modulator 122 is shown to generate such a dynamic VCC voltage based on a battery voltage Vbatt.

When the amplification path 130 is operated in the foregoing manner, its impedance Z is relatively low (e.g., about 3 to 5Ω); and thus, impedance transformation typically needs to occur to match with impedance associated with a downstream component. In the example of FIG. 6, a band switch 138 (depicted as being part of a band switch system 118) that receives the output of the amplification path 130 is typically configured as a 50Ω load. Accordingly, and assuming that the impedance (Z) presented by the amplification path 130 is about 4Ω, an impedance transformation of about 13:1 (50:4) needs to be implemented. In the example of FIG. 6, such an impedance transformation is shown to be implemented by an output matching network (OMN) 136 which is depicted as being part of a load transform system 116.

In the example of FIG. 6, the band switch 138 is depicted as having a single input from the output of the amplification path 130 (through the OMN 136), and three outputs corresponding to three example frequency bands. Three duplexers 142a-142c are shown to be provided for such three frequency bands.

Each of the three duplexers 142a-142c is shown to include TX and RX filters (e.g., bandpass filters). Each TX filter is shown to be coupled to the band switch 138 to receive the corresponding amplified and switch-routed RF signal for transmission. Such an RF signal is shown to be filtered and routed to an antenna port (ANT) (144a, 144b or 144c). Each RX filter is shown to receive an RX signal from the corresponding antenna port (ANT) (144a, 144b or 144c). Such an RX signal is shown to be filtered and routed to an RX component (e.g., an LNA) for further processing.

It is typically desirable to provide impedance matching between a given duplexer and a component that is upstream (in the TX case) or downstream (in the RX case). In the example of FIG. 6, the band switch 138 is such an upstream component for the TX filter of the duplexer. Accordingly, matching circuits 140a-140c (depicted as being parts of, for example, a PI network 120) are shown to be implemented between the outputs of the band switch 138 and the respective duplexers 142a-142c. In some embodiments, each of such matching circuits 140a-140c can be implemented as, for example, a pi-matching circuit.

Table 1 lists example values of insertion loss and efficiency for the various components of the ET power amplification system 110 of FIG. 6. It will be understood that the various values listed are approximate values.

TABLE 1

| Component | Insertion loss | Efficiency |
| --- | --- | --- |
| ET Mod (112) | N/A | 83% |
| Power Amp. Assy. (114) | N/A | 70% to 75% (PAE) |
| Load Transform (116) | 0.5 dB to 0.7 dB | 85% to 89% |
| Band Switch (118) | 0.3 dB to 0.5 dB | 89% to 93% |
| PI (120) | 0.3 dB | 93% |
| Duplex (122) | 2.0 dB | 63% |

From Table 1, one can see that the ET power amplification system 110 of FIG. 6 includes a significant number of loss contributors. Even if each component of the system 110 is assumed to operate at its upper limit of efficiency, the total efficiency of the ET power amplification system 110 is approximately 31% (0.83×0.75×0.89×0.93×0.93×0.63).

In the example of FIG. 7, the HV APT power amplification system 100 is depicted as being configured to provide amplification for the same three frequency bands as in the example ET power amplification system 110 of FIG. 6. In a power amplifier assembly 104, three separate amplification paths can be implemented, such that each amplification path provides amplification for its respective frequency band. For example, the first amplification path is shown to include a PA 168a which receives an RF signal from an input node 162a through a DC-block capacitance 164a. The amplified RF signal from the PA 168a is shown to be routed to a downstream component through a capacitance 170a. Similarly, the second amplification path is shown to include a PA 168b which receives an RF signal from an input node 162b through a DC-block capacitance 164b; and the amplified RF signal from the PA 168b is shown to be routed to a downstream component through a capacitance 170b. Similarly, the third amplification path is shown to include a PA 168c which receives an RF signal from an input node 162c through a DC-block capacitance 164c; and the amplified RF signal from the PA 168c is shown to be routed to a downstream component through a capacitance 170c.

In some embodiments, some or all of the PAs 168a-168c can include, for example, HBT PAs. It will be understood that one or more features of the present disclosure can also be implemented with other types of PAs. For example, PAs that can be operated to yield impedances that match or are close to downstream components (e.g., by HV operation and/or through other operating parameter(s)) can be utilized to yield one or more of the benefits as described herein.

In the example of FIG. 7, each PA (168a, 168b or 168c) is shown to be provided with a supply voltage VCC from a boost DC/DC converter 160 through a choke inductance (166a, 166b or 166c). The boost DC/DC converter 160 is depicted as being part of an HV system 102. The boost DC/DC converter 160 can be configured to supply such a range of VCC voltage values (e.g., about 1V to 10V), including HV ranges or values as described herein. The boost DC/DC converter 160 is shown to generate such a high VCC voltage based on a battery voltage Vbatt.

When the PAs 168a-168c are operated in the foregoing manner with high VCC voltage (e.g., at about 10V), impedance Z of each PA is relatively high (e.g., about 40Ω to 50Ω); and thus, impedance transformation is not necessary to match with impedance associated with a downstream component. In the example of FIG. 7, each of the duplexers 174a-174c (depicted as being parts of a duplex assembly 108) that receives the output of the corresponding PA (168a, 168b or 168c) is typically configured as a 50Ω load. Accordingly, and assuming that the impedance (Z) presented by the PA (168a, 168b or 168c) is about 50Ω, an impedance transformation (such as the load transform system 116 in FIG. 6) is not needed.

It is typically desirable to provide impedance matching between a given duplexer and a component that is upstream (in the TX case) or downstream (in the RX case). In the example of FIG. 7, the PA (168a, 168b or 168c) is such an upstream component for the TX filter of the duplexer (174a, 174b or 174c). Accordingly, matching circuits 172a-172c (depicted as being parts of, for example, a PI network 106) can be implemented between the respective outputs of the PAs 168a-168c and the respective duplexers 174a-174c. In some embodiments, each of such matching circuits 172a-172c can be implemented as, for example, a pi-matching circuit.

In the example of FIG. 7, the HV operation of the PAs 168a-168c can result in each of the PAs 168a-168c presenting an impedance Z that is similar to the impedance of the corresponding duplexer. Since impedance transformation is not needed in such a configuration, there is no need for an impedance transformer (116 in FIG. 6).

It is also noted that operation of the PAs 168a-168c at the higher impedance can result in much lower current levels within the PAs 168a-168c. Such lower current levels can allow the PAs 168a-168c to be implemented in significantly reduced die size(s).

In some embodiments, either or both of the foregoing features (elimination of impedance transformer and reduced PA die size) can provide additional flexibility in power amplification architecture design. For example, space and/or cost savings provided by the foregoing can allow implementation of a relatively small PA (168a, 168b or 168c in FIG. 7) for each frequency band, thereby removing the need for a band switch system (e.g., 118 in FIG. 6). Accordingly, size, cost and/or complexity associated with the HV APT power amplification system 100 of FIG. 7 can be maintained or reduced when compared to the ET power amplification system 110 of FIG. 6, while significantly reducing the overall loss of the power amplification system 100.

Table 2 lists example values of insertion loss and efficiency for the various components of the HV APT power amplification system 100 of FIG. 7. It will be understood that the various values listed are approximate values.

TABLE 2

| Component | Insertion loss | Efficiency |
|---|---|---|
| HV (102) | N/A | 93% |
| Power Amp. Assy. (104) | N/A | 80% to 82% (PAE) |
| PI (106) | 0.3 dB | 93% |
| Duplex (108) | 2.0 dB | 63% |

From Table 2, one can see that the HV APT power amplification system 100 of FIG. 7 includes a number of loss contributors. However, when compared to the ET power amplification system 110 of FIG. 6 and Table 1, two significant loss contributors (Load Transform (116) and Band Switch (118)) are absent in the HV APT power amplification system 100 of FIG. 7. Elimination of such loss contributors is shown to remove about 1 dB in the transmit path in the example of FIG. 7 and Table 2.

Also referring to Table 2, if each component of the system 100 is assumed to operate at its upper limit of efficiency (as in the example of Table 1), the total efficiency of the HV APT power amplification system 100 is approximately 45% (0.93×0.82×0.93×0.63). Even if each component is assumed to operate at its lower limit of efficiency, the total efficiency of the HV APT power amplification system 100 is approximately 44% (0.93×0.80×0.93×0.63). One can see that in either case, the total efficiency of the HV APT power amplification system 100 of FIG. 7 is significantly higher than the total efficiency (approximately 31%) of the ET power amplification system 110 of FIG. 6.

Referring to FIGS. 6 and 7, a number of features can be noted. It is noted that use of the DC/DC boost converter (160 in FIG. 7) can allow elimination of one or more other power converters that may be utilized in a PA system. For example, when operated to yield an HV supply voltage (e.g., 10 VDC), 1 Watt $(10V)^2/(2\times50\Omega)$ of RF power can be produced with no harmonic terminations.

It is further noted that a PA driven as a 50 Ω load (e.g., FIG. 7) results in a significantly lower loss per Ohm than a PA driven as a 3 Ω load (e.g., FIG. 6). For example, an equivalent series resistance (ESR) of 0.1 Ω has an insertion loss of about 0.14 dB when the PA is driven at 3 Ω, while for the PA driven at 50 Ω, an ESR of 0.1 Ω has an insertion loss of about 0.008 dB. Accordingly, the 3 Ω PA can have a total insertion loss of about 4.2 dB (0.14 dB×30), while the 50 Ω PA can have a total insertion loss of about 4.0 dB (0.008 dB×500), which is still less than the total insertion loss for the 3 Ω PA.

It is further noted that the 50 Ω PA can have a significantly higher gain than the 3 Ω PA. For example, gain can be approximated as $G_M \times R_{LL}$; if $G_M$ is similar for both cases, then the higher value of 50 Ω yields a higher gain.

Figure 8:
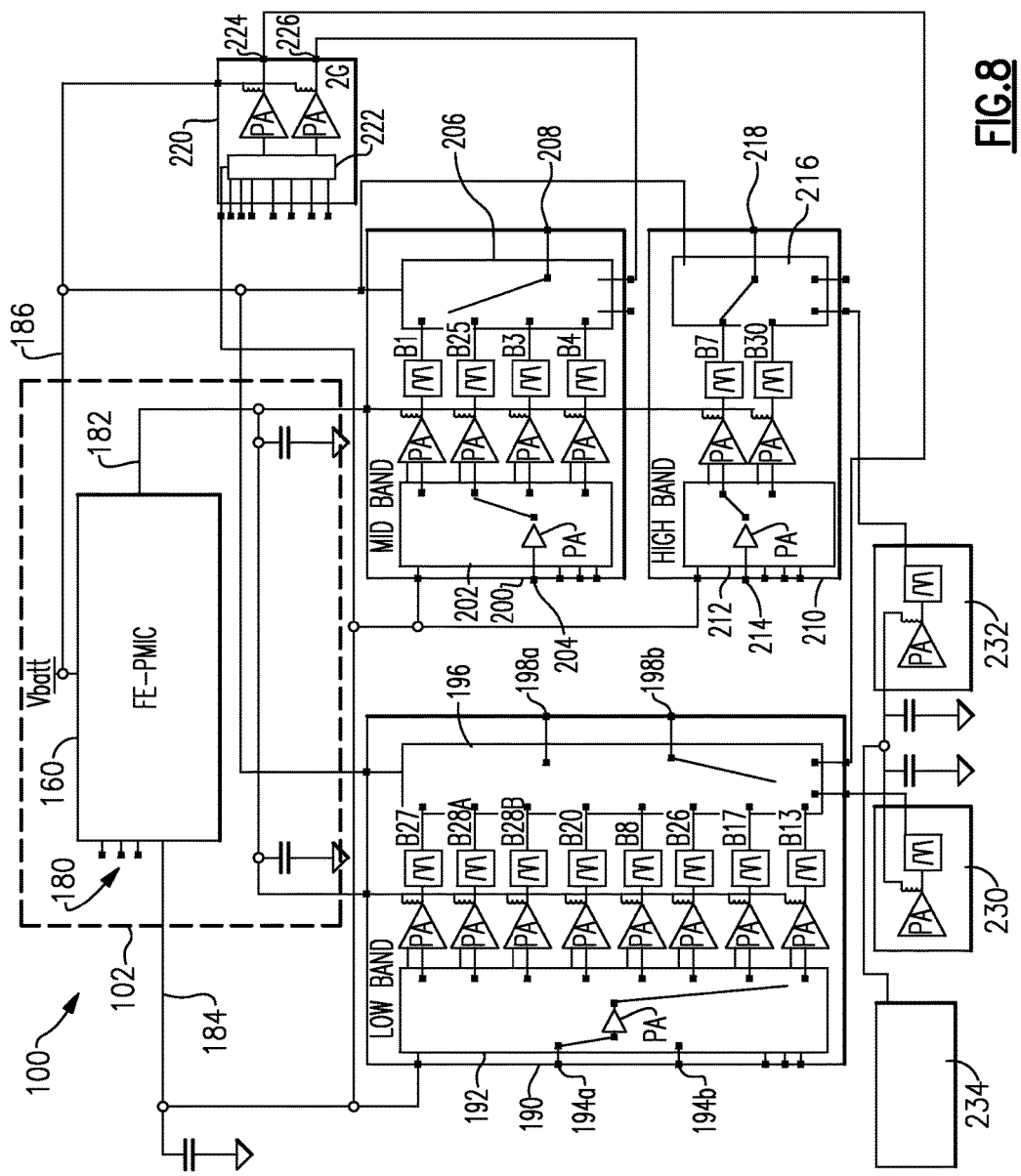
FIG. 8 shows an HV APT power amplification system that can be a more specific example of the HV APT power amplification system of FIG. 7.

FIG. 8 shows an HV APT power amplification system 100 that can be a more specific example of the HV APT power amplification system 100 of FIG. 7. In the example of FIG. 8, a power amplifier assembly can include a low-band (LB) power amplifier assembly 190, a mid-band (MB) power amplifier assembly 200, and a high-band (HB) power amplifier assembly 210, with some or all of PAs in such assemblies capable of being operated with high-voltage as described herein. The power amplifier assembly can also include other PAs that do not operate in high-voltage. For example, a 2G power amplifier assembly 220 and power amplifier assemblies 230, 232 can be operated in lower voltages.

In the example of FIG. 8, the foregoing high-voltage(s) can be provided to the LB, MB and HB power amplifier assemblies 190, 200, 210 from, for example, a front-end power management integrated circuit (FE-PMIC) 160. In some embodiments, such an FE-PMIC can include a DC/DC boost converter (e.g., 160 in FIG. 7) as described herein.

The FE-PMIC 160 can receive a battery voltage Vbatt and generate a high-voltage output 182 as supply voltages (VCC) for the LB, MB and HB power amplifier assemblies 190, 200, 210. In some embodiments, such a high-voltage VCC can have a value of approximately 10V, with a maximum current of approximately 250 mA. It will be understood that other values of such high-voltage VCC and/or maximum current can also be utilized.

The FE-PMIC 160 can also generate other output(s). For example, an output 184 can provide bias signals for the PAs associated with the LB, MB and HB power amplifier assemblies 190, 200, 210, as well as for the 2G power amplifier assembly 220. In some embodiments, such a bias signal can have a value of approximately 4V, with a maximum current of approximately 50 mA. It will be understood that other values of such bias signal and/or maximum current can also be utilized.

In the example of FIG. 8, the FE-PMIC 160 can be part of an HV system 102 described herein in reference to FIG. 7. The FE-PMIC 160 can include one or more interface nodes 180. Such interface nodes can be utilized to facilitate, for example, control of the FE-PMIC 160.

In the example of FIG. 8, supply voltage VCC for the 2G power amplifier assembly 220 is shown to be provided (e.g., line 186) substantially directly from the battery voltage Vbatt. Such Vbatt is also shown to provide operating voltages for various switches associated with the LB, MB and HB power amplifier assemblies 190, 200, 210. In some embodiments, such Vbatt can have a value in a range of about 2.5V to 4.5V. It will be understood that other values of such Vbatt can also be utilized.

In the example of FIG. 8, supply voltages VCC for the power amplifier assemblies 230, 232 can be provided from a DC/DC switching regulator 234.

Referring to FIG. 8, the LB power amplifier assembly 190 is shown to include separate PAs for eight example frequency bands B27, B28A, B28B, B20, B8, B26, B17 and B13. Each PA is shown to provide its amplified RF signal to a corresponding duplexer. As described herein, such eight PAs can be coupled to their respective duplexers without a band selection switch in between.

The LB power amplifier assembly 190 is further shown to include and/or be coupled to an input switch 192 and an output switch 196. The input switch 192 is shown to include two input nodes 194a, 194b, and eight output nodes corresponding to the eight PAs. In the input switch 192, the two input nodes 194a, 194b are shown to be switchable to a common node which is coupled to another common node for switching to one of the eight output nodes. The coupling between such common nodes can include an amplification element.

The output switch 196 is shown to include eight input nodes corresponding to the eight duplexers, and two output nodes 198a, 198b. The output switch 196 can further include inputs for receiving an output of the 2G power amplifier assembly 220 and an output of the power amplifier assembly 230.

It will be understood that the LB power amplifier assembly 190 can include different combinations of frequency bands.

Referring to FIG. 8, the MB power amplifier assembly 200 is shown to include separate PAs for four example frequency bands B1, B25, B3 and B4. Each PA is shown to provide its amplified RF signal to a corresponding duplexer. As described herein, such four PAs can be coupled to their respective duplexers without a band selection switch in between.

The MB power amplifier assembly 200 is further shown to include and/or be coupled to an input switch 202 and an output switch 206. The input switch 202 is shown to include an input node 204, and four output nodes corresponding to the four PAs. In the input switch 202, the input node 204 is shown to be coupled to a common node for switching to one of the four output nodes. The coupling between such nodes can include an amplification element.

The output switch 206 is shown to include four input nodes corresponding to the four duplexers, and an output node 208. The output switch 206 can further include an input for receiving an output of the 2G power amplifier assembly 220.

It will be understood that the MB power amplifier assembly 200 can include different combinations of frequency bands.

Referring to FIG. 8, the HB power amplifier assembly 210 is shown to include separate PAs for two example frequency bands B7 and B20. Each PA is shown to provide its amplified RF signal to a corresponding duplexer. As described herein, such two PAs can be coupled to their respective duplexers without a band selection switch in between.

The HB power amplifier assembly 210 is further shown to include and/or be coupled to an input switch 212 and an output switch 216. The input switch 212 is shown to include an input node 214, and two output nodes corresponding to the two PAs. In the input switch 212, the input node 214 is shown to be coupled to a common node for switching to one of the two output nodes. The coupling between such nodes can include an amplification element.

The output switch 216 is shown to include two input nodes corresponding to the two duplexers, and an output node 218. The output switch 216 can further include an input for receiving an output of the power amplifier assembly 232.

It will be understood that the HB power amplifier assembly 210 can include different combinations of frequency bands.

In the example of FIG. 8, the PAs of the LB, MB and HB power amplifier assemblies 190, 200, 210 can be implemented as one or more die. For example, such PAs can be implemented on a single HBT (e.g., GaAs) die, on separate HBT die corresponding to the LB, MB and HB power amplifier assemblies 190, 200, 210, or some combination thereof.

In the example of FIG. 8, each of the input switches 192, 202, 212 can be configured to provide switching functionalities as described herein, as well as to facilitate biasing functionalities as described herein. In some embodiments, the switches 192, 196, 202, 206, 212, 216 can be implemented on, for example, a single silicon-on-insulator (SOI) die, on separate die corresponding to the various functional groups, or some combination thereof.

Figure 9:
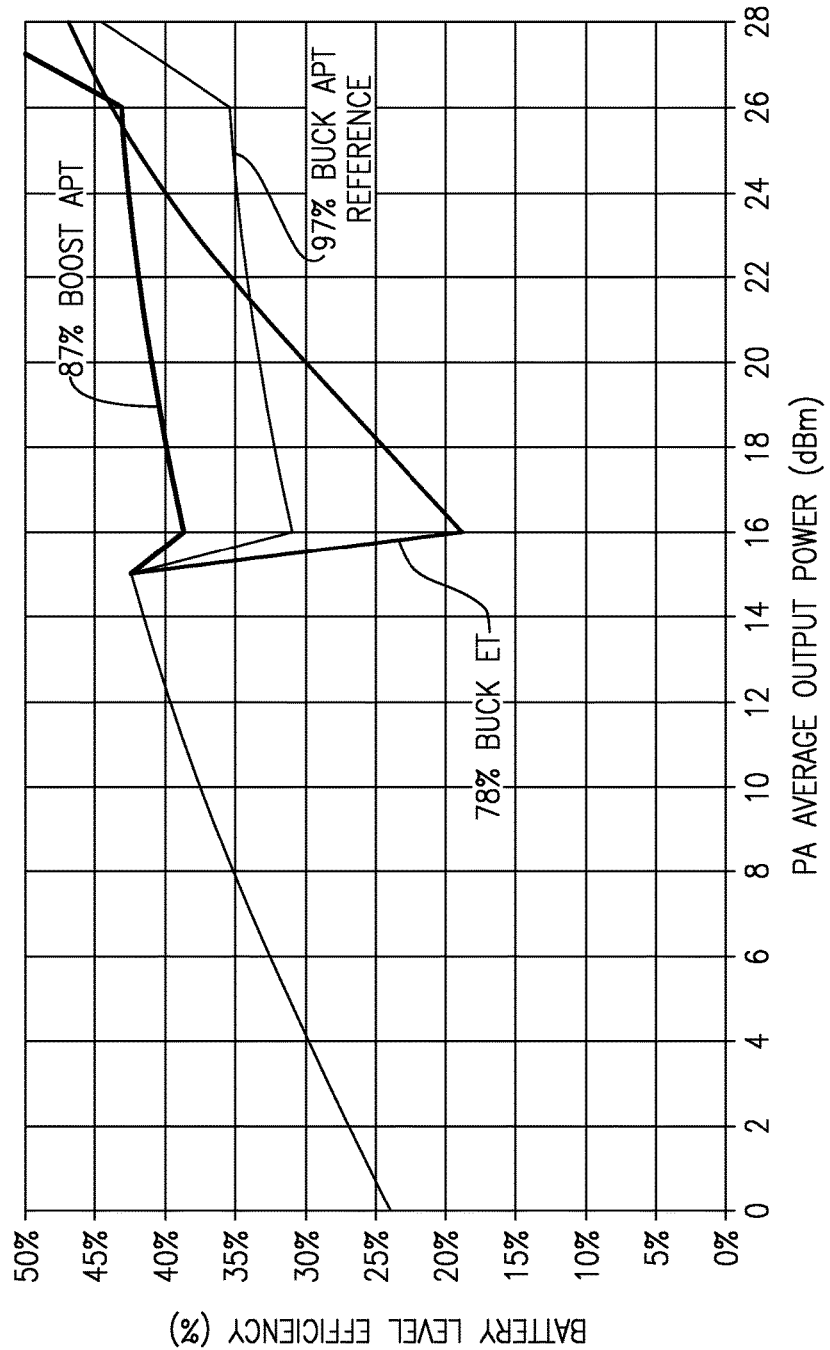
FIG. 9 shows example efficiency plots as a function of output power, for power amplifiers operated in Buck ET, Buck APT, and Boost APT configurations.

FIG. 9 shows example efficiency plots as a function of output power, for power amplifiers operated in 78% Buck ET, 97% Buck APT, and 87% Boost APT configurations. It is noted that all three of the example configurations yield a similar efficient efficiency profile up to about 15 dBm of output power. Beyond such an output level, one can see that the 87% Boost APT configuration has significantly higher efficiency values over both of the 97% Buck APT and 78% Buck ET configurations. Such a Boost APT configuration can be implemented in either or both of the example HV APT power amplification systems of FIGS. 7 and 8.

Figure 10:
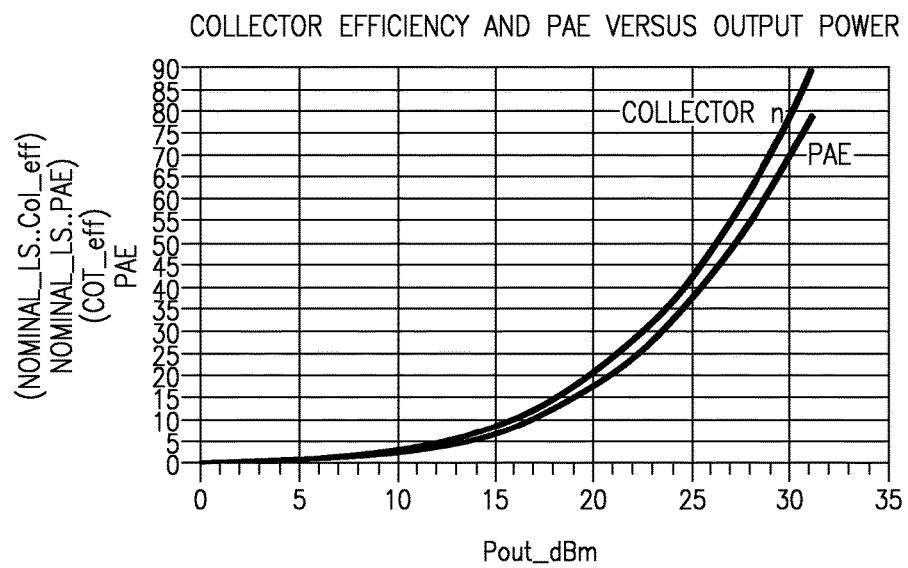
FIG. 10 shows that a power amplification system having one or more features as described herein can have collector efficiency and power-added efficiency (PAE) profiles that are similar to nominal cases.

FIG. 10 shows that a power amplification system (e.g., HV APT power amplification system 100 of FIG. 8) having one or more features as described herein can have collector efficiency and power-added efficiency (PAE) profiles that are similar to nominal cases. For example, collector efficiency plots (as a function of output power) associated with the HV APT power amplification system of FIG. 8 are shown to have substantially same profiles as those of respective nominal collector efficiencies. Similarly, PAE plots (as a function of output power) associated with the HV APT power amplification system of FIG. 8 are shown to have substantially same profiles as those of respective nominal PAEs.

Figure 11:
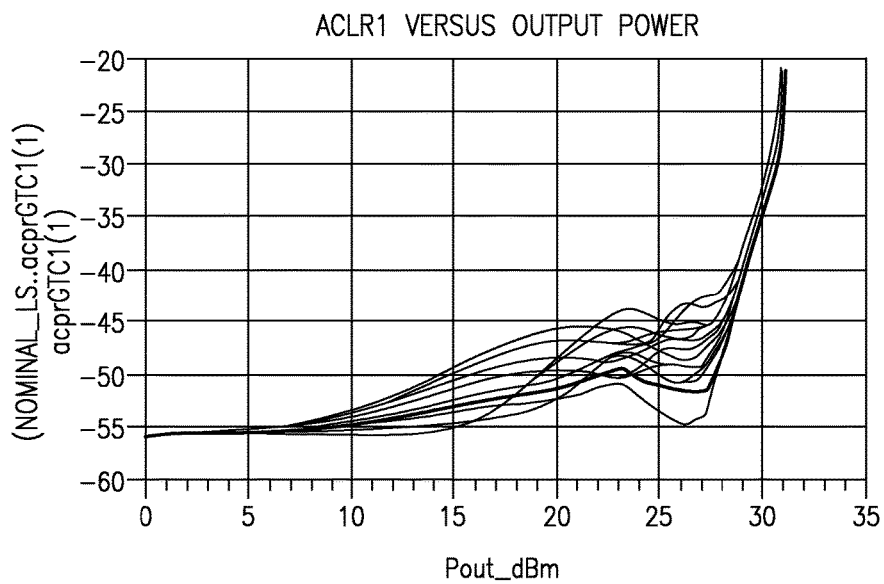
FIG. 11 shows that a power amplification system having one or more features as described herein can have linearity performance that is similar to a nominal case.

FIG. 11 shows that a power amplification system (e.g., HV APT power amplification system 100 of FIG. 8) having one or more features as described herein can have linearity performance (e.g., adjacent-channel leakage ratio (ACLR)) that is similar to a nominal case. For example, ACLR plots (as a function of output power) associated with the HV APT power amplification system of FIG. 8 are shown to have substantially same profiles as those of respective nominal ACLRs at higher output power values (e.g., higher than 29 dBm).

Figure 12:
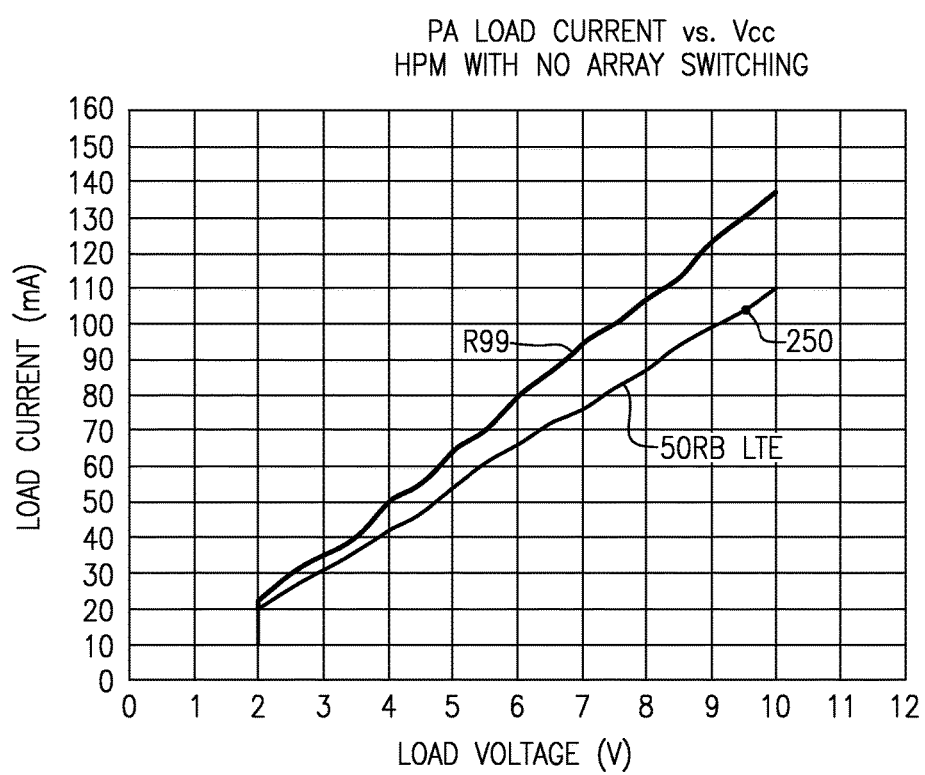
FIG. 12 shows example plots of power amplifier load current as a function of load voltage.

FIG. 12 shows example plots of power amplifier load current as a function of load voltage for power amplifier configurations indicated as "R99" and "50RB LTE." Suppose that a relatively low current condition of 40 mA is desired for the power amplifier configurations. For example, such a current of 40 mA can result from subtracting fixed bias current and quiescent current from the supply current (load current in FIG. 12). For the 50RB LTE example in FIG. 12, a load current of approximately 104 mA can yield such a low current (40 mA) condition for the power amplifier configuration. Such a load current of 104 mA corresponds to a load voltage (VCC) of approximately 9.5V, as indicated by point 250. Accordingly, one can see that a high-voltage power amplifier operating configuration as described herein can yield a relatively low current condition for the power amplifier.

Figure 13:
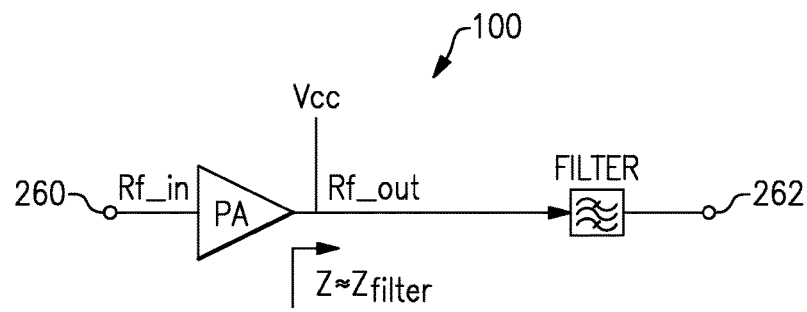
FIG. 13 shows an example where a power amplification system having one or more features as described herein can yield one or more advantageous benefits.

Examples of Advantageous Features:

FIGS. 13-16 show examples of advantageous benefits that can be obtained in HV APT power amplification systems having one or more features as described herein. As described herein, FIG. 13 shows that in some embodiments, a power amplification system 100 can include a power amplifier (PA) configured to receive a radio-frequency (RF) signal (RF_in) at an input node 260. Such a PA can be provided with a supply voltage of Vcc, and such a supply voltage can include a high-voltage (HV) value as described herein. The amplified RF signal can be output as RF_out, and be routed to a filter that is configured to condition the amplified RF signal and yield a filtered signal at an output node 262. The PA can be operated (e.g., in an HV mode) to be driven at approximately a characteristic load impedance of the filter. Such a characteristic load impedance of the filter can be, for example, approximately 50 Ohms.

In some embodiments, the foregoing configuration can be implemented in an average-power tracking (APT) PA system so as to yield one or more advantageous features. For example, a less complex supply configuration, reduced loss, and improved efficiency can be realized. In another example, the foregoing PA, a die having the foregoing power amplification system 100, and/or a module having the foregoing power amplification system 100 can be implemented in as a reduced-sized device. In some embodiments, such reduced-sized device can be realized at least in part due to elimination of some or all of the PA's output matching networks (OMNs) in a power amplification system.

Figure 14:
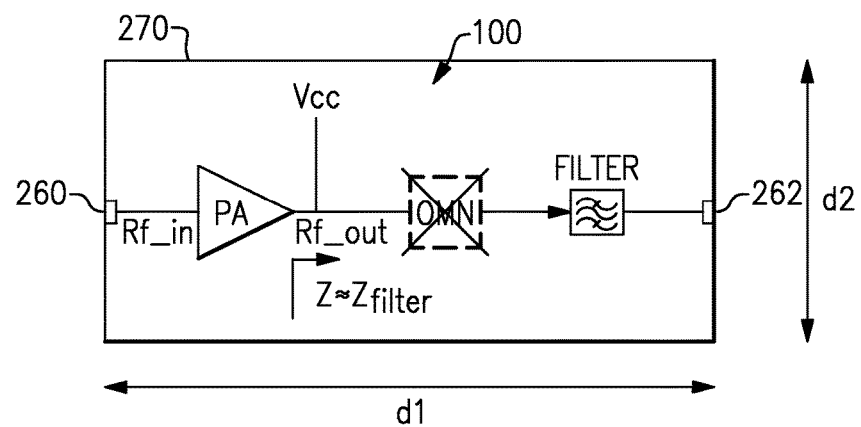
FIG. 14 shows another example where a power amplification system having one or more features as described herein can yield one or more advantageous benefits.

FIG. 14 shows an example of a power amplification system 100 in which an output matching network (OMN) (also referred to herein as an impedance transformation circuit) associated with a PA is substantially eliminated between the PA and a filter. In the example of FIG. 14, the PA, its supply voltage Vcc, and the filter can be configured and operated similar to the example of FIG. 14. Such a PA configuration can include an HV mode of operation as described herein.

In the example of FIG. 14, some or all of the power amplification system 100 can be implemented on a device 270 such as a PA die or a PA module. With the foregoing elimination of the OMN, dimensions (e.g., d1×d2) associated with the device 270 can be reduced. Further, other advantageous features such as reduced loss and improved efficiency can also be realized with the elimination of the OMN.

Figure 15:
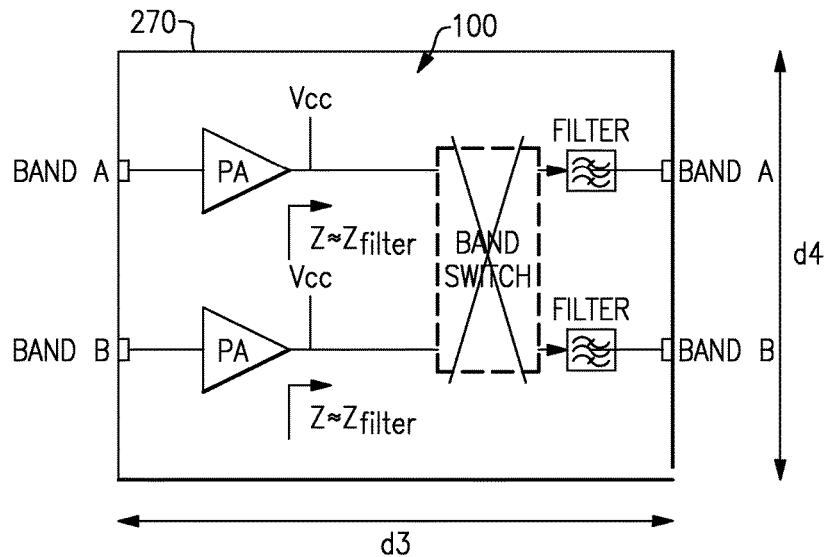
FIG. 15 shows yet another example where a power amplification system having one or more features as described herein can yield one or more advantageous benefits.

FIG. 15 shows an example of a power amplification system 100 configured to process RF signals for a plurality of bands. Such bands can be, for example, Band A and Band B. It will be understood that other numbers of bands can be implemented for the power amplification system 100.

In the example of FIG. 15, each band is shown to have associated with it a separate amplification path. In each amplification path, its PA, supply voltage Vcc, and filter can be configured and operated similar to the example of FIG. 14. Such a PA configuration can include an HV mode of operation as described herein.

In the example of FIG. 15, each band having its own dedicated amplification path can allow elimination of a band selection switch. Accordingly, a device 270 (such as a PA die or a PA module) having some or all of the power amplification system 100 can have reduced dimensions (e.g., d3×d4). Further, other advantageous features such as reduced loss and improved efficiency can also be realized with the elimination of the band selection switch.

Figure 16:
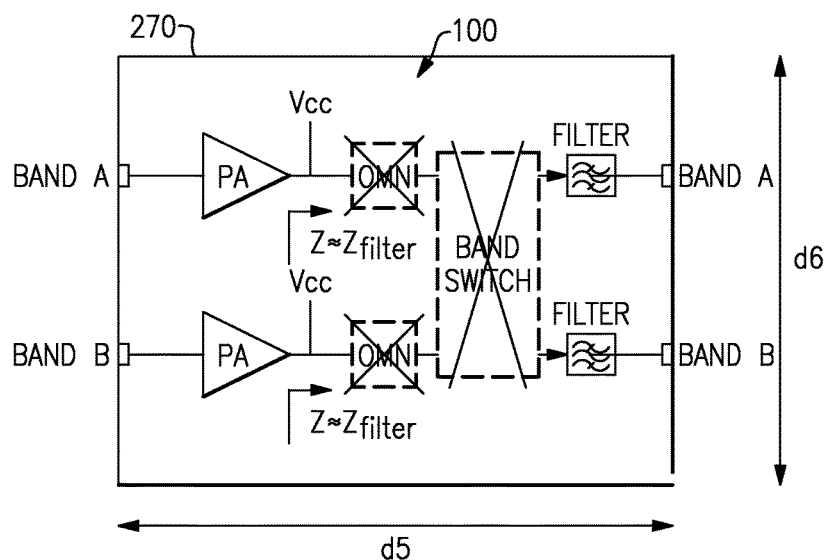
FIG. 16 shows yet another example where a power amplification system having one or more features as described herein can yield one or more advantageous benefits.

FIG. 16 shows an example of a power amplification system 100 configured to process RF signals for a plurality of bands, similar to the example of FIG. 15. In the example of FIG. 16, each of some or all of the plurality of amplification path can be substantially free of an output matching network (OMN) (also referred to herein as an impedance transformation circuit), similar to the example of FIG. 14. Accordingly, a device 270 (such as a PA die or a PA module) having some or all of the power amplification system 100 can have reduced dimensions (e.g., d5×d6). Further, other advantageous features such as reduced loss and improved efficiency can also be realized with the elimination of the band selection switch and some or all of the OMNs.

In the examples of FIGS. 15 and 16, the device 270 on which its respective power amplification system 100 is implemented can be, for example, a power amplifier die having a semiconductor substrate. The plurality of PAs can be implemented in parallel as shown on the semiconductor substrate, and each PA can be configured to drive an individual narrow frequency band signal path. Thus, each PA can be sized smaller than a wide band PA capable of driving more than one of the frequency bands associated with the plurality of PAs. As described herein, use of such miniaturized single-band PAs can yield a number of desirable features.

Figure 17:
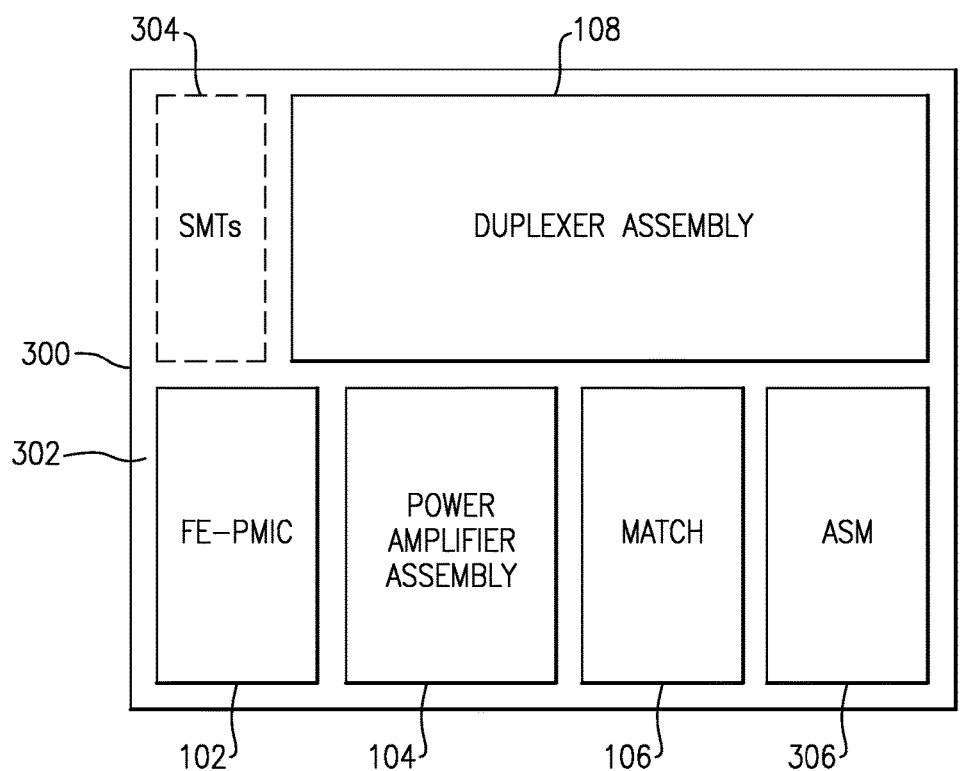
FIG. 17 shows that in some embodiments, some or all of an HV APT power amplification system having one or more features as described herein can be implemented in a module.

Examples of Products:

FIG. 17 shows that in some embodiments, some or all of an HV APT power amplification system having one or more features as described herein can be implemented in a module. Such a module can be, for example, a front-end module (FEM). In the example of FIG. 17, a module 300 can include a packaging substrate 302, and a number of components can be mounted on such a packaging substrate. For example, an FE-PMIC component 102, a power amplifier assembly 104, a match component 106, and a duplexer assembly 108 can be mounted and/or implemented on and/or within the packaging substrate 302. Other components such as a number of SMT devices 304 and an antenna switch module (ASM) 306 can also be mounted on the packaging substrate 302. Although all of the various components are depicted as being laid out on the packaging substrate 302, it will be understood that some component(s) can be implemented over or under other component(s).

In some implementations, a power amplification system having one or more features as described herein can be included in an RF device such as a wireless device. Such a power amplification system can be implemented in the wireless device as one or more circuits, as one or more die, as one or more packaged modules, or in any combination thereof. In some embodiments, such a wireless device can include, for example, a cellular phone, a smart-phone, a hand-held wireless device with or without phone functionality, a wireless tablet, etc.

Figure 18:
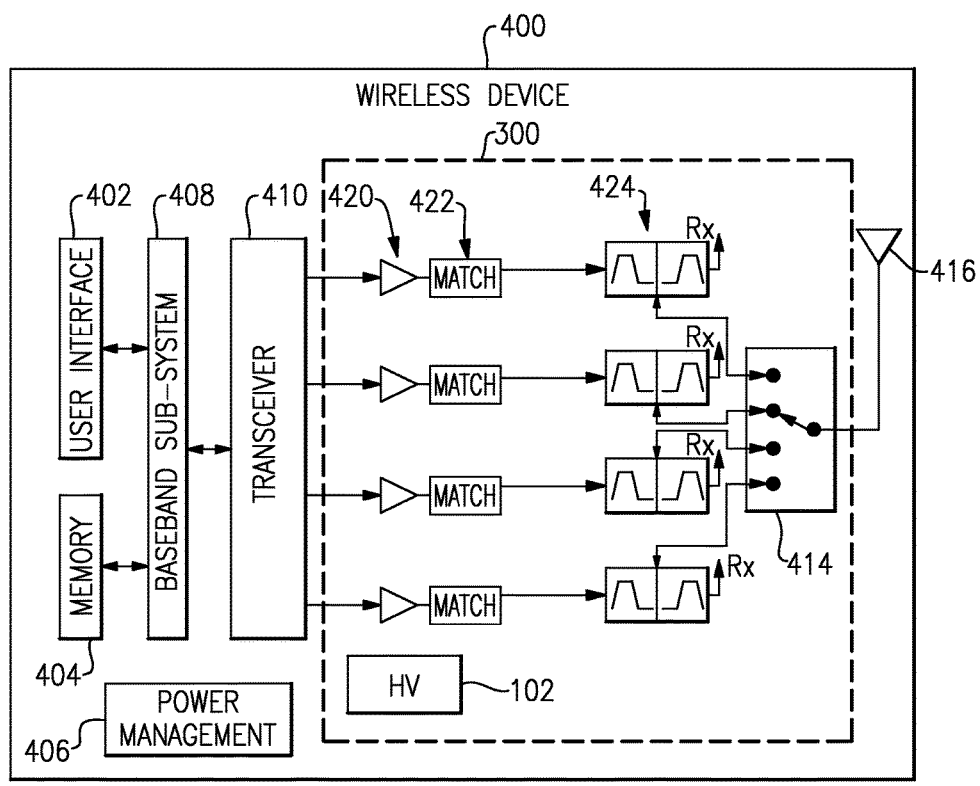
FIG. 18 depicts an example wireless device having one or more advantageous features described herein.

FIG. 18 depicts an example wireless device 400 having one or more advantageous features described herein. In the context of a module having one or more features as described herein, such a module can be generally depicted by a dashed box 300, and can be implemented as, for example, a front-end module (FEM).

Referring to FIG. 18, power amplifiers (PAs) 420 can receive their respective RF signals from a transceiver 410 that can be configured and operated to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 can also be in communication with a power management component 406 that is configured to manage power for the operation of the wireless device 400. Such power management can also control operations of the baseband sub-system 408 and the module 300.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

In the example wireless device 400, outputs of the PAs 420 are shown to be matched (via respective match circuits 422) and routed to their respective duplexers 424. In some embodiments, the match circuit 422 can be similar to the example matching circuits 172a-172c described herein in reference to FIG. 7. As also described herein in reference to FIG. 7, the outputs of the PAs 420 can be routed to their respective duplexers 424 without impedance transformation (e.g., with load transformation 116 in FIG. 6) when the PAs 420 are operated in an HV mode with HV supply. Such amplified and filtered signals can be routed to an antenna 416 through an antenna switch 414 for transmission. In some embodiments, the duplexers 424 can allow transmit and receive operations to be performed simultaneously using a common antenna (e.g., 416). In FIG. 18, received signals are shown to be routed through the duplexers 424 to "Rx" paths that can include, for example, one or more low-noise amplifiers (LNAs).

In the example of FIG. 18, the foregoing HV supply for the PAs 420 can be provided by an HV component 102. Such an HV component can include, for example, a boost DC/DC converter as described herein.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

As described herein, one or more features of the present disclosure can provide a number of advantages when implemented in systems such as those involving the wireless device of FIG. 18. For example, significant current drain reduction can be achieved through an elimination or reduction of output loss. In another example, lower bill of materials count can be realized for the power amplification system and/or the wireless device. In yet another example, independent optimization or desired configuration of each supported frequency band can be achieved due to, for example, separate PAs for their respective frequency bands. In yet another example, optimization or desired configuration of maximum or increased output power can be achieved through, for example, a boost supply voltage system. In yet another example, a number of different battery technologies can be utilized, since maximum or increased power is not necessarily limited by battery voltage.

One or more features of the present disclosure can be implemented with various cellular frequency bands as described herein. Examples of such bands are listed in Table 3. It will be understood that at least some of the bands can be divided into sub-bands. It will also be understood that one or more features of the present disclosure can be implemented with frequency ranges that do not have designations such as the examples of Table 3.

TABLE 3

| Band | Mode | Tx Frequency Range (MHz) | Rx Frequency Range (MHz) |
|---|---|---|---|
| B1 | FDD | 1,920-1,980 | 2,110-2,170 |
| B2 | FDD | 1,850-1,910 | 1,930-1,990 |
| B3 | FDD | 1,710-1,785 | 1,805-1,880 |
| B4 | FDD | 1,710-1,755 | 2,110-2,155 |
| B5 | FDD | 824-849 | 869-894 |
| B6 | FDD | 830-840 | 875-885 |
| B7 | FDD | 2,500-2,570 | 2,620-2,690 |
| B8 | FDD | 880-915 | 925-960 |
| B9 | FDD | 1,749.9-1,784.9 | 1,844.9-1,879.9 |
| B10 | FDD | 1,710-1,770 | 2,110-2,170 |
| B11 | FDD | 1,427.9-1,447.9 | 1,475.9-1,495.9 |
| B12 | FDD | 699-716 | 729-746 |
| B13 | FDD | 777-787 | 746-756 |
| B14 | FDD | 788-798 | 758-768 |
| B15 | FDD | 1,900-1,920 | 2,600-2,620 |
| B16 | FDD | 2,010-2,025 | 2,585-2,600 |
| B17 | FDD | 704-716 | 734-746 |
| B18 | FDD | 815-830 | 860-875 |
| B19 | FDD | 830-845 | 875-890 |
| B20 | FDD | 832-862 | 791-821 |
| B21 | FDD | 1,447.9-1,462.9 | 1,495.9-1,510.9 |
| B22 | FDD | 3,410-3,490 | 3,510-3,590 |
| B23 | FDD | 2,000-2,020 | 2,180-2,200 |
| B24 | FDD | 1,626.5-1,660.5 | 1,525-1,559 |
| B25 | FDD | 1,850-1,915 | 1,930-1,995 |
| B26 | FDD | 814-849 | 859-894 |
| B27 | FDD | 807-824 | 852-869 |
| B28 | FDD | 703-748 | 758-803 |
| B29 | FDD | N/A | 716-728 |
| B30 | FDD | 2,305-2,315 | 2,350-2,360 |
| B31 | FDD | 452.5-457.5 | 462.5-467.5 |
| B33 | TDD | 1,900-1,920 | 1,900-1,920 |
| B34 | TDD | 2,010-2,025 | 2,010-2,025 |
| B35 | TDD | 1,850-1,910 | 1,850-1,910 |
| B36 | TDD | 1,930-1,990 | 1,930-1,990 |
| B37 | TDD | 1,910-1,930 | 1,910-1,930 |
| B38 | TDD | 2,570-2,620 | 2,570-2,620 |
| B39 | TDD | 1,880-1,920 | 1,880-1,920 |
| B40 | TDD | 2,300-2,400 | 2,300-2,400 |
| B41 | TDD | 2,496-2,690 | 2,496-2,690 |
| B42 | TDD | 3,400-3,600 | 3,400-3,600 |
| B43 | TDD | 3,600-3,800 | 3,600-3,800 |
| B44 | TDD | 703-803 | 703-803 |

In the description herein, references are made to various forms of impedance. For example, a PA is sometimes referred to as driving a load impedance of a downstream component such as a filter. In another example, a PA is sometimes referred to as having an impedance value. For the purpose of description, it will be understood that such impedance-related references to a PA may be used interchangeably. Further, an impedance of a PA can include its output impedance as seen on the output side of the PA. Accordingly, such a PA being configured to drive a load impedance of a downstream component can include the PA having an output impedance that is approximately same as the load impedance of the downstream component.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplification system comprising:
   a plurality of power amplifiers, each configured to amplify a signal in a respective frequency band in an average power tracking mode; and
   an output filter coupled to each power amplifier and having a load impedance, each power amplifier configured to be operated with a high voltage to provide an impedance that is approximately the same as the load impedance of the respective output filter, such that the power amplification system with the power amplifiers operated with the respective high voltages has a lower loss compared to another power amplification system having similar band handling capability but in which power amplifiers are operated with respective low voltages.

2. The power amplification system of claim 1 wherein the impedance of each power amplifier has a value greater than approximately 40 Ohms.

3. The power amplification system of claim 2 wherein the impedance of each power amplifier has a value of approximately 50 Ohms.

4. The power amplification system of claim 1 further comprising a supply system configured to provide the respective high voltage to each power amplifier.

5. The power amplification system of claim 4 wherein the supply system includes a boost DC/DC converter configured to generate the high-voltage based on a battery voltage Vbatt.

6. The power amplification system of claim 1 wherein each power amplifier includes a heterojunction bipolar transistor implemented as a gallium arsenide device.

7. The power amplification system of claim 6 wherein the high voltage is provided to a collector of the heterojunction bipolar transistor as a supply voltage.

8. The power amplification system of claim 1 wherein each output filter is a transmit filter configured to operate in a corresponding transmit frequency band.

9. The power amplification system of claim 8 wherein the transmit filter is part of a duplexer configured to operate in the transmit frequency band and a corresponding receive frequency band.

10. The power amplification system of claim 1 wherein each output filter is coupled to the respective power amplifier by an output path that is substantially free of an impedance transformation circuit.

11. The power amplification system of claim 1 wherein the power amplification system is substantially free of a band selection switch between the power amplifiers and their corresponding output filters.

12. The power amplification system of claim 1 wherein the high voltages provided to the respective power amplifiers have substantially the same value.

13. The power amplification system of claim 1 wherein the other power amplifier system is an envelope tracking power amplification system.

14. A wireless device comprising:
   a transceiver;
   a front-end module in communication with the transceiver and including a power amplification system having a plurality of power amplifiers, each configured to amplify a signal in a respective frequency band in an average power tracking mode, the power amplification system further including an output filter coupled to each power amplifier and having a load impedance, each power amplifier configured to be operated with a high voltage to provide an impedance that is approximately the same as the load impedance of the respective output filter, such that the power amplification system with the power amplifiers operated with the respective high voltages has a lower loss compared to another power amplification system having similar band handling capability but in which power amplifiers are operated with respective low voltages; and
   an antenna in communication with the front-end module and configured to transmit the amplified signal associated with each of one or more of the power amplifiers.

15. A method for processing a signal, the method comprising:
   amplifying the signal with a selected one of a plurality of power amplifiers each configured to operate in an average power tracking mode;
   filtering the amplified signal with a selected one of output filters corresponding to the plurality of power amplifiers, each output filter having a load impedance; and
   operating the selected power amplifier with a high voltage such that the power amplifier provides an impedance that is approximately the same as the load impedance of the respective output filter, such that the amplifying of the signal with the selected power amplifier operated with the respective high voltage results in a lower loss compared to amplifying of a signal with a selected one of similar power amplifiers having similar band handling capability but in which the selected power amplifier is operated with a low voltage.

* * * * *